(12) United States Patent
Kwon et al.

(10) Patent No.: US 12,336,092 B2
(45) Date of Patent: Jun. 17, 2025

(54) CIRCUIT BOARD, LENS DRIVING DEVICE, AND CAMERA MODULE INCLUDING THE SAME

(71) Applicant: LG INNOTEK CO., LTD., Seoul (KR)

(72) Inventors: Na Kyung Kwon, Seoul (KR); Hae Sik Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 231 days.

(21) Appl. No.: 17/932,879

(22) Filed: Sep. 16, 2022

(65) Prior Publication Data

US 2023/0017158 A1 Jan. 19, 2023

(30) Foreign Application Priority Data

Sep. 16, 2021 (KR) .......................... 10-2021-0124377
Sep. 16, 2021 (KR) .......................... 10-2021-0124378

(51) Int. Cl.
*H05K 1/02* (2006.01)
*H05K 1/03* (2006.01)

(52) U.S. Cl.
CPC ......... *H05K 1/0298* (2013.01); *H05K 1/0306* (2013.01); *H05K 1/0353* (2013.01)

(58) Field of Classification Search
CPC ........ H04N 23/52; H04N 23/54; H04N 23/57; H04N 23/6812; H04N 23/685;
(Continued)

(56) References Cited

U.S. PATENT DOCUMENTS 7,060,364 B2  6/2006  Kataoka et al.
7,665,915 B2 *  2/2010  Lee ................... H01L 27/14683
                                            396/529
(Continued)

FOREIGN PATENT DOCUMENTS

| JP | 2019-512734 A | 5/2019 | |
|---|---|---|---|
| KR | 10-2004-0058061 A | 7/2004 | |
| KR | 10-1184543 B1 | 9/2012 | |
| KR | 10-2019-0008923 A | 1/2019 | |
| KR | 10-2020-0073051 A | 6/2020 | |
| KR | 10-2021-0043244 A | 4/2021 | |
| WO | WO-2020180078 A1 * | 9/2020 | ............... G03B 3/10 |

OTHER PUBLICATIONS

Office Action dated Apr. 21, 2025 in Korean Application No. 10-2021-0124377.

*Primary Examiner* — Timothy J Thompson
*Assistant Examiner* — Guillermo J Egoavil
(74) *Attorney, Agent, or Firm* — Saliwanchik, Lloyd & Eisenschenk

(57) ABSTRACT

A circuit board according to an embodiment includes: an insulating part; and a pattern part disposed on the insulating part, wherein the insulating part includes first and second insulating regions spaced apart from each other with an open region interposed therebetween, the pattern part includes: a first terminal portion disposed in a plurality of first side regions of the first insulating region adjacent to the open region; a second terminal portion disposed on a plurality of second side regions of the second insulating region facing the plurality of first side regions with the open region interposed therebetween; and a connecting portion disposed in the open region and connecting between the first and second terminal portions, wherein the connecting portion includes a plurality of bent portions connecting between the first terminal portion and the second terminal portion disposed in the first side region and the second side region which do not face each other and formed at a plurality of corners of the open region, the plurality of bent portions are bent to rotate in the same direction as each other, each of the first terminal portion, the second terminal portion, and the connecting portion includes a metal layer and a surface treatment layer disposed on the metal layer, and the metal layer includes a first metal layer and a second metal layer that is disposed on the first metal layer and has an electrical conductivity different from that of the first metal layer.

19 Claims, 16 Drawing Sheets

(58) Field of Classification Search
CPC .. H05K 1/0277; H05K 1/0298; H05K 1/0306; H05K 1/0353; H05K 1/09; H05K 1/181; H05K 1/02; H05K 1/03; H05K 1/0204; H05K 1/0271; H05K 1/0281; H05K 1/0283; H05K 1/119; H05K 1/185; H05K 2201/0311; H05K 2201/0338; H05K 2201/0394; H05K 2201/066; H05K 2201/09063; H05K 2201/09272; H05K 2201/09409; H05K 2201/09781; H05K 2201/10121; H05K 2201/10151; H05K 2201/10969; H05K 3/0061; H05K 3/202
USPC .................................. 174/255; 348/378, 374
See application file for complete search history.

(56) References Cited

U.S. PATENT DOCUMENTS

| | | | |
|---|---|---|---|
| 8,928,601 B2 * | 1/2015 | Lee | G06F 3/04164 345/173 |
| 12,273,998 B2 | 4/2025 | Son et al. | |
| 2004/0219341 A1 | 11/2004 | Kataoka et al. | |
| 2007/0126081 A1 * | 6/2007 | Webster | H01L 27/14618 257/565 |
| 2018/0279481 A1 | 9/2018 | Gay | |
| 2022/0061147 A1 | 2/2022 | Kim et al. | |
| 2022/0353389 A1 * | 11/2022 | Kim | H04N 23/54 |
| 2024/0244746 A1 | 7/2024 | Son et al. | |

* cited by examiner (a)

(b)

(a)

(b)

(c)

(a)

(b)

(c)

CIRCUIT BOARD, LENS DRIVING DEVICE, AND CAMERA MODULE INCLUDING THE SAME

CROSS-REFERENCE TO RELATED APPLICATIONS

The present application claims priority under 35 U.S.C. 119 and 35 U.S.C. 365 to Korean Patent Application Nos. 10-2021-0124377, filed on Sep. 16, 2021; and 10-2021-0124378, filed on Sep. 16, 2021; which are hereby incorporated by reference in their entirety.

TECHNICAL FIELD

The embodiment relates to a substrate, and more particularly, to a substrate, a lens driving device, and a camera module including the same.

BACKGROUND

As various portable terminals are widely used and the wireless Internet service is commercialized, needs of consumers related to the portable terminals are diversified, and accordingly, various kinds of additional devices are installed in the portable terminals.

A representative one of them is a camera module that captures a subject in a photograph or a video. Meanwhile, a recent camera module may perform an autofocus (AF) function that automatically adjusts a distance between an image sensor and a lens to align a focal length of the lens.

In addition, the camera module may perform a zooming function of zooming up or zooming out, which increases or decreases the magnification of a distant subject through a zoom lens.

In addition, recently, camera modules employ an image stabilization (IS) technology to correct or inhibit image stabilization due to an unstable fixing device or a camera movement caused by a user's movement or vibration or shock.

SUMMARY

Technical Problem

An embodiment is directed to providing a substrate capable of improving drivability of an image sensor, a lens driving device, and a camera module including the same.

In addition, the embodiment is directed to providing a substrate including a pattern part having a multilayer structure, a lens driving device, and a camera module including the same.

In addition, the embodiment is directed to providing a substrate including a pattern part having a low specific resistance value while satisfying physical properties, a lens driving device, and a camera module including the same.

In addition, the embodiment is directed to providing a substrate including a pattern part having an improved communication speed while increasing an allowable current, a lens driving device, and a camera module including the same.

In addition, the embodiment is directed to providing a substrate including a pattern part having an improved communication speed while increasing an allowable current, a lens driving device, and a camera module including the same.

Technical Solution

A circuit board according to an embodiment includes: an insulating part; and a pattern part disposed on the insulating part, wherein the insulating part includes first and second insulating regions spaced apart from each other with an open region interposed therebetween, the pattern part includes: a first terminal portion disposed in a plurality of first side regions of the first insulating region adjacent to the open region; a second terminal portion disposed on a plurality of second side regions of the second insulating region facing the plurality of first side regions with the open region interposed therebetween; and a connecting portion disposed in the open region and connecting between the first and second terminal portions, wherein the connecting portion includes a plurality of bent portions connecting between the first terminal portion and the second terminal portion disposed in the first side region and the second side region which do not face each other and formed at a plurality of corners of the open region, the plurality of bent portions are bent to rotate in the same direction as each other, each of the first terminal portion, the second terminal portion, and the connecting portion includes a metal layer and a surface treatment layer disposed on the metal layer, and the metal layer includes a first metal layer and a second metal layer that is disposed on the first metal layer and has an electrical conductivity different from that of the first metal layer.

In addition, the circuit board further includes a third metal layer disposed between the insulating part and the first metal layer.

In addition, an electrical conductivity of the second metal layer is greater than that conductivity of the first metal layer.

In addition, a surface roughness of an upper surface of the second metal layer is lower than that of a lower surface of the third metal layer.

In addition, the second metal layer includes a first region that vertically overlaps an upper surface of the first metal layer and a second region that does not vertically overlap the upper surface of the first metal layer and vertically overlaps a side surface of the first metal layer.

In addition, a vertical cross-sectional shape of the first metal layer is different from that of the second metal layer.

In addition, the second metal layer is disposed on the upper surface of the first metal layer, a lower surface of the first metal layer is not in contact with the second metal layer, and the surface treatment layer includes a portion in contact with the first metal layer and a portion in contact with the second metal layer.

In addition, the second metal layer includes a 2-1 metal layer disposed on the upper surface of the first metal layer and a 2-2 metal layer disposed on the lower surface of the first metal layer, and the surface treatment layer includes the portion in contact with the first metal layer, a portion in contact with the 2-1 metal layer, and a portion in contact with the 2-2 metal layer.

In addition, a vertical cross-sectional shape of the 2-1 metal layer is different from that of the 2-2 metal layer.

In addition, the second metal layer has a thickness in a range of 1 μm to 15 μm.

In addition, a thickness of the 2-2 metal layer is smaller than that of the 2-1 metal layer.

In addition, at least a part of the 2-1 metal layer vertically overlaps a side surface of the 2-2 metal layer.

In addition, the second metal layer is respectively disposed on the upper surface, the lower surface, and the side surface of the first metal layer.

In addition, the surface treatment layer is disposed to surround the second metal layer and is not in contact with the first metal layer.

In addition, a thickness of the second metal layer satisfies a range of 0.5 μm to 4.0 μm.

In addition, the first metal layer has a slope in which a width increases from the upper surface toward the lower surface thereof, and the second metal layer has a slope corresponding to the slope of the first metal layer and is disposed on the side surface of the first metal layer.

In addition, the surface treatment layer includes at least one of an organic material, an inorganic material, and an organic-inorganic composite.

Advantageous Effects

A lens driving device according to an embodiment includes a circuit board for moving an image sensor connected to a sensor part. The circuit board includes an insulating part and a pattern part. In addition, the pattern part includes a metal layer and a surface treatment layer formed on the metal layer. In this case, the metal layer may include a first metal layer and a second metal layer. The second metal layer may be provided to solve low electrical conductivity and a high specific resistance value of the first layer.

For example, the second metal layer is formed of a metal material having high electrical conductivity. Through this, in the embodiment, it is possible to lower the specific resistance value while lowering the overall electrical conductivity of the pattern part. Accordingly, in the embodiment, an allowable current or a communication speed of the pattern part may be improved. Through this, in the embodiment, it is possible to provide a circuit board for moving an image sensor applicable to an image sensor having a high resolution.

In addition, in the embodiment, when the pattern part is formed through an etching process, the second metal layer is etched with the lowest etching rate. Accordingly, the second metal layer includes a first region that vertically overlaps an upper surface of the first metal layer and a second region that does not vertically overlap the upper surface of the first metal layer. In addition, the second region may vertically overlap a side surface of the first metal layer and at least a part of a side surface of the first metal layer. Through this, in the embodiment, by making a width of the second metal layer larger than that of the upper surface of the first metal layer, a width of an upper surface and a width of a lower surface of the pattern part can be reduced, and further, an etching factor of the pattern part can be increased. Through this, in the embodiment, the signal transmission loss can be reduced by reducing a difference between an upper width and a lower width of the pattern part, and further, communication performance can be improved.

In addition, in an embodiment, the second metal layer may be disposed only on the upper surface of the first metal layer. In addition, in another embodiment, the second metal layer may be disposed on the upper surface and the lower surface of the first metal layer, respectively. Accordingly, in the embodiment, it is possible to increase the electrical conductivity while further lowering a specific resistance value of the pattern part. Through this, in the embodiment, it is possible to further increase the allowable current of the pattern part and improve the communication speed of the pattern part.

In addition, in the embodiment, a thickness of a 2-1 metal layer disposed on the first metal layer among the second metal layers is greater than the thickness of a 2-2 metal layer disposed under the first metal layer. Through this, it is possible to increase the etching factor while lowering the specific resistance value of the pattern part.

Meanwhile, in another embodiment, the second metal layer may be provided to entirely cover an outer surface of the first metal layer, that is, the second metal layer is formed on the first metal layer after the first metal layer is etched. Accordingly, the second metal layer may be disposed on the first metal layer while maintaining a shape of the etched first metal layer. Through this, in the embodiment, it is easy to control a shape of the pattern part, thereby improving the uniformity of the shape of the pattern part. In addition, in the embodiment, as the second metal layer is formed after the first metal layer is etched, the second metal layer is disposed not only on the upper surface of the first metal layer but also on a part of the side surface and the lower surface. Accordingly, in an embodiment, a thickness of the second metal layer required to reduce the specific resistance value of the pattern part to a certain level or less may be reduced. Accordingly, in the embodiment, as the thickness of the second metal layer increases, the specific resistance value may be further lowered, and the thickness of the second metal layer required for a target specific resistance value may be reduced. Through this, in the embodiment, product reliability may be further improved and product unit price may be reduced.

In addition, in the embodiment, in forming the surface treatment layer, the surface treatment layer is in contact with the second metal layer. For example, the first metal layer is covered by the second metal layer, whereby the surface treatment layer is not in contact with the first metal layer. Accordingly, in the embodiment, the stability of chemical reaction may be secured, thereby improving the uniformity of a structure of the surface treatment layer.

In addition, the surface treatment layer in the embodiment may be a thin film formed by coating an organic material. In this case, a relative permittivity $\varepsilon_r$ of an organic material is 3.24. This is a value significantly smaller than a relative permittivity $\varepsilon_r$ of nickel or gold (Au) constituting a conventional surface treatment layer. For example, the relative permittivity $\varepsilon_r$ of the nickel or gold (Au) is 4 or more. Accordingly, in the embodiment, by forming the surface treatment layer through organic material coating, it is possible to improve a signal transmission speed of a wiring inversely proportional to the relative permittivity. Accordingly, in the embodiment, product reliability of the circuit board may be improved.

In addition, thermal conductivity of the organic material constituting the surface treatment layer of the embodiment is greater than that of a conventional nickel or metal layer. Accordingly, in the embodiment, it is possible to increase thermal conductivity of the pattern part including the surface treatment layer. Here, recently, in a product such as a camera module, heat dissipation characteristics have emerged as a major problem. That is, various components included in the camera module have a problem of being vulnerable to heat dissipation, and accordingly, efforts are being made to improve heat dissipation characteristics. In this case, in the embodiment, in the surface treatment of the pattern part as described above, the thermal conductivity of the pattern part may be increased by applying the surface treatment layer through the organic coating, and thus, it is possible to improve heat dissipation characteristics of the circuit board, and further, heat dissipation characteristics of the camera module to which the circuit board is applied.

In addition, in the embodiment, the pattern part included in the circuit board is one of components of the first moving part. That is, the connecting portion constituting the pattern part may move in a plurality of directions during operation of the camera module. For example, the connecting portion is shifted or tilted in at least one direction of an X-axis, a Y-axis, and a Z-axis together with an image sensor in order to auto-focus the camera module or inhibit hand shake. In this case, the pattern part included in the circuit board may be in contact with other components during the moving operation as described above. In addition, when the pattern part is in contact with other components, a problem may occur in electrical reliability of the pattern part. In this case, in the embodiment, by forming the surface treatment layer through the organic coating of the pattern part as described above, it is possible to improve the electrical reliability. For example, in the embodiment, the surface treatment layer has electrical conductivity lower than that of the conventional nickel or gold (Au). Accordingly, in the embodiment, when the pattern part is in contact with other components, the surface treatment layer may perform an insulating function, thereby improving the electrical reliability of the circuit board. In addition, in the embodiment, as the surface treatment layer of the pattern part is formed through the organic coating, the plating process may be simplified compared to the conventional surface treatment layer, and further, costs of the plating process may be reduced.

DETAILED DESCRIPTION OF THE EMBODIMENTS

Hereinafter, embodiments of the present disclosure will be described in detail with reference to the accompanying drawings.

However, the spirit and scope of the present disclosure is not limited to a part of the embodiments described, and may be implemented in various other forms, and within the spirit and scope of the present disclosure, one or more of the elements of the embodiments may be selectively combined and replaced.

In addition, unless expressly otherwise defined and described, the terms used in the embodiments of the present disclosure (including technical and scientific terms) may be construed the same meaning as commonly understood by one of ordinary skill in the art to which the present disclosure belongs, and the terms such as those defined in commonly used dictionaries may be interpreted as having a meaning that is consistent with their meaning in the context of the relevant art. In addition, the terms used in the embodiments of the present disclosure are for describing the embodiments and are not intended to limit the present disclosure.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present disclosure, the terms such as first, second, A, B, (a), and (b) may be used.

These terms are only used to distinguish the elements from other elements, and the terms are not limited to the essence, order, or order of the elements. In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Hereinafter, a configuration of a camera module will be described with reference to the drawings.

Figure 1:
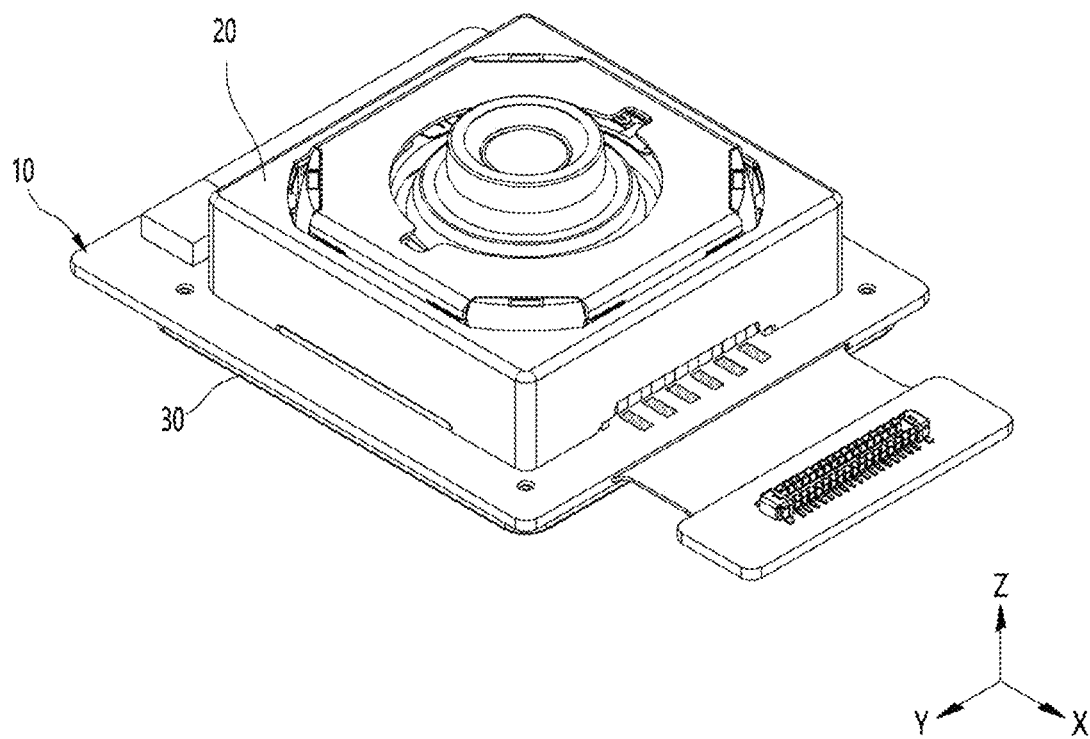
FIG. 1 is a perspective view of a camera module according to an embodiment.
Figure 2:
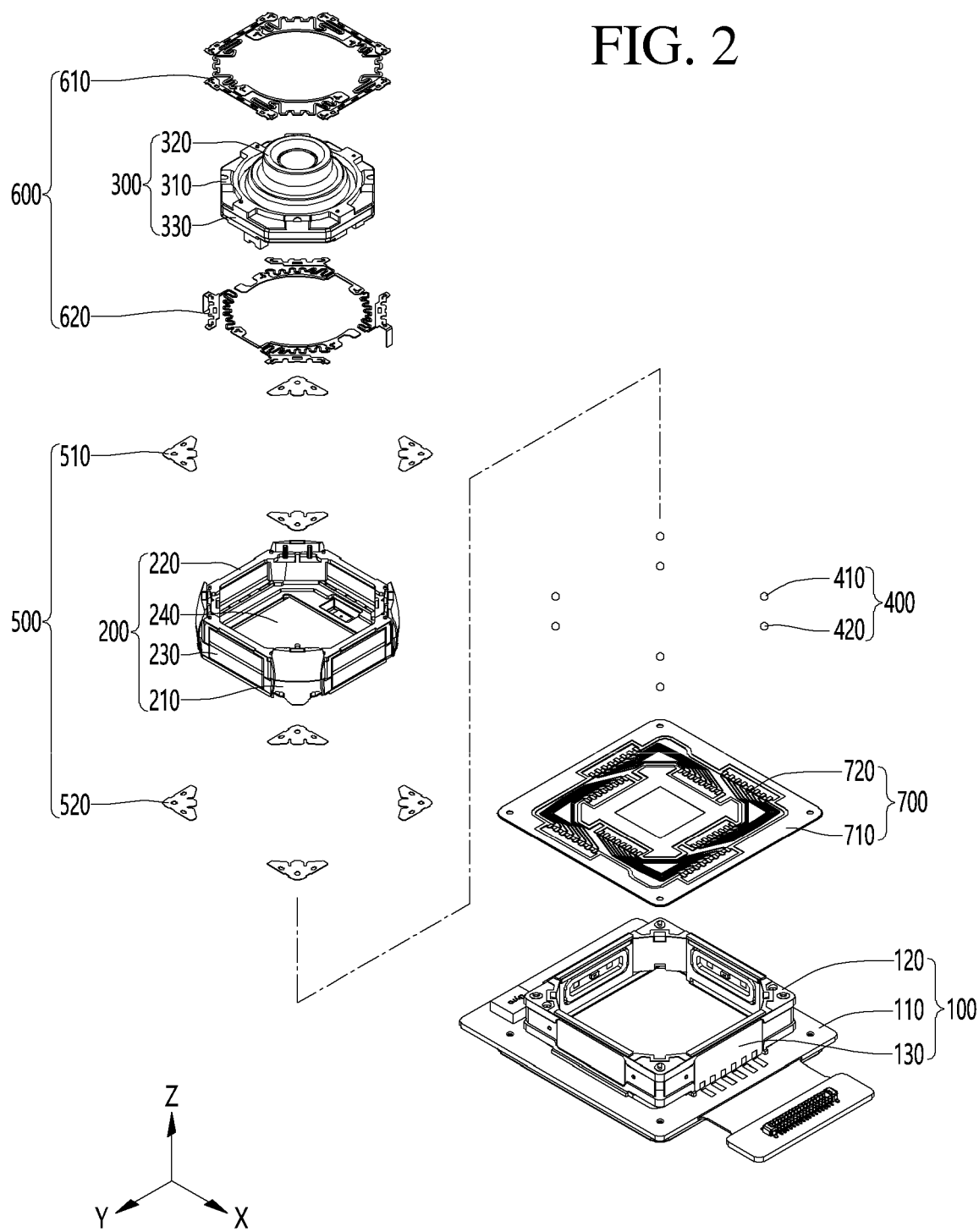
FIG. 2 is an exploded perspective view of a lens driving device of FIG. 1.

FIG. 1 is a perspective view of a camera module according to an embodiment, and FIG. 2 is an exploded perspective view of a lens driving device of FIG. 1.

Hereinafter, the camera module according to the embodiment will be briefly described with reference to FIGS. 1 and 2.

The camera module may include a lens driving device 10 and a case.

The case may include a first case 20 and a second case 30.

In addition, the lens driving device 10 may include a fixed part 100, a first moving part 200, a second moving part 300, a guide member 400, a first elastic member 500, a second elastic member 600, and a substrate 700.

The substrate 700 may be an interposer. The substrate 700 may be coupled to the first moving part 200. For example, the substrate 700 may be coupled to a sensor part 240 of the first moving part 200. In addition, the substrate 700 may electrically connect the fixed part 100 and the sensor part 240. Further, the substrate 700 may allow the sensor part 240 to move relative to the fixed part 100. For example, the substrate 700 may electrically connect between the sensor part 240 and the fixed part 100 and may elastically support the sensor part 240 so that the sensor part 240 may move relative to the fixed part 100.

The fixed part 100 may refer to a part of which a position is fixed in the lens driving device 10. For example, the position of the fixed part 100 may be fixed during an OIS operation or an AF operation of the lens driving device 10. The fixed part 100 may be disposed to surround the outside of the first moving part 200. The fixed part 100 may be spaced apart from the first moving part 200. Preferably, the fixed part 100 may be a part of which a position is fixed when the first moving part 200 moves during the OIS operation of the lens driving device 10. In addition, the fixed part 100 may be a part of which a position is fixed when the second moving part 300 moves during the AF operation of the lens driving device 10. The fixed part 100 may include a main substrate 110, a first frame 120, and a first driving member 130.

The first moving part 200 may be disposed in an inner space of the fixed part 100. The first moving part 200 may be disposed in the inner space of the fixed part 100 to be spaced apart from the first moving part 200. The first moving part 200 may move relative to the fixed part 100 in the inner space of the fixed part 100. For example, the first moving part 200 may rotate based on a first axis. For example, the first moving part 200 may perform a yawing operation configured to rotate based on an x-axis corresponding to the first axis. For example, the first moving part 200 may rotate based on a second axis perpendicular to the first axis. For example, the first moving part 200 may perform a pitching operation configured to rotate based on a y-axis corresponding to the second axis. Specifically, the first moving part 200 may be an OIS module for the OIS operation. Here, the rotation may include inclination or tilting. The first moving part 200 may include a second frame 210, a sub-frame 220, a second driving member 230, and the sensor part 240.

The second moving part 300 may be disposed in an inner space of the first moving part 200. The second moving part 300 may move relative to the fixed part 100 and the first moving part 200. For example, the second moving part 300 may move based on a third axis. For example, the second moving part 300 may perform an auto-focusing operation configured to move in a z-axis (or optical axis) corresponding to the third axis. Specifically, the second moving part 300 may be an AF module for an AF operation. The second moving part 300 may include a third frame 310, a lens 320, and a third driving member 330.

The guide member 400 may be a rolling member. For example, the guide member 400 may include a plurality of balls. The guide member 400 may be disposed between the fixed part 100 and the first moving part 200. The guide member 400 may guide the first moving part 200 so as to move relative to the fixed part 100. The guide member 400 may include an upper guide member 410 and a lower guide member 420.

The first elastic member 500 may be a pressure member. The first elastic member 500 may correspond to the guide member 400. The first elastic member 500 may be provided to correspond to the number of balls constituting the guide member 400. The first elastic member 500 may be disposed on the fixed part 100. The first elastic member 500 may press the guide member 400. Specifically, the first elastic member 500 may include a coupling region coupled to the fixed part 100 and a contact region extending from the coupling region and contacting the guide member 400. In addition, the contact region of the first elastic member 500 may have an elastic force, and accordingly, the guide member 400 may be pressurized in a z-axis direction. The first elastic member 500 may include a first upper elastic member 510 and a first lower elastic member 520.

The second elastic member 600 may elastically couple the second moving part 300 to the first moving part 200. For example, the second elastic member 600 may elastically support the moving part 300 the second elastic member 600 with respect to the first moving part 200 so that the second moving part 300 may move in the inner space of the first moving part 200. Accordingly, the second moving part 300 may move in the z-axis direction corresponding to the optical axis by the elastic force of the second elastic member 600 in a state in which the second moving part 300 is elastically coupled to the first moving part 200. The second elastic member 600 may include a second upper elastic member 610 and a second lower elastic member 620.

The substrate 700 may electrically connect the fixed part 100 and the first moving part 200. In this case, the substrate 700 may be elastically connected so that the first moving part 200 may move relative to the fixed part 100. The substrate 700 may include a 'pattern part' that is elastically bent when the first moving part 200 moves while electrically connecting the fixed part 100 and the first moving part 200. For example, the substrate 700 may be referred to as an 'interposer' disposed between the fixed part 100 and the sensor part 240 of the first moving part 200. For example, the substrate 700 may be referred to as a 'sensor movement substrate' that enables the relative movement of the sensor part 240 of the first moving part 200 with respect to the fixed part 100.

Figure 3:
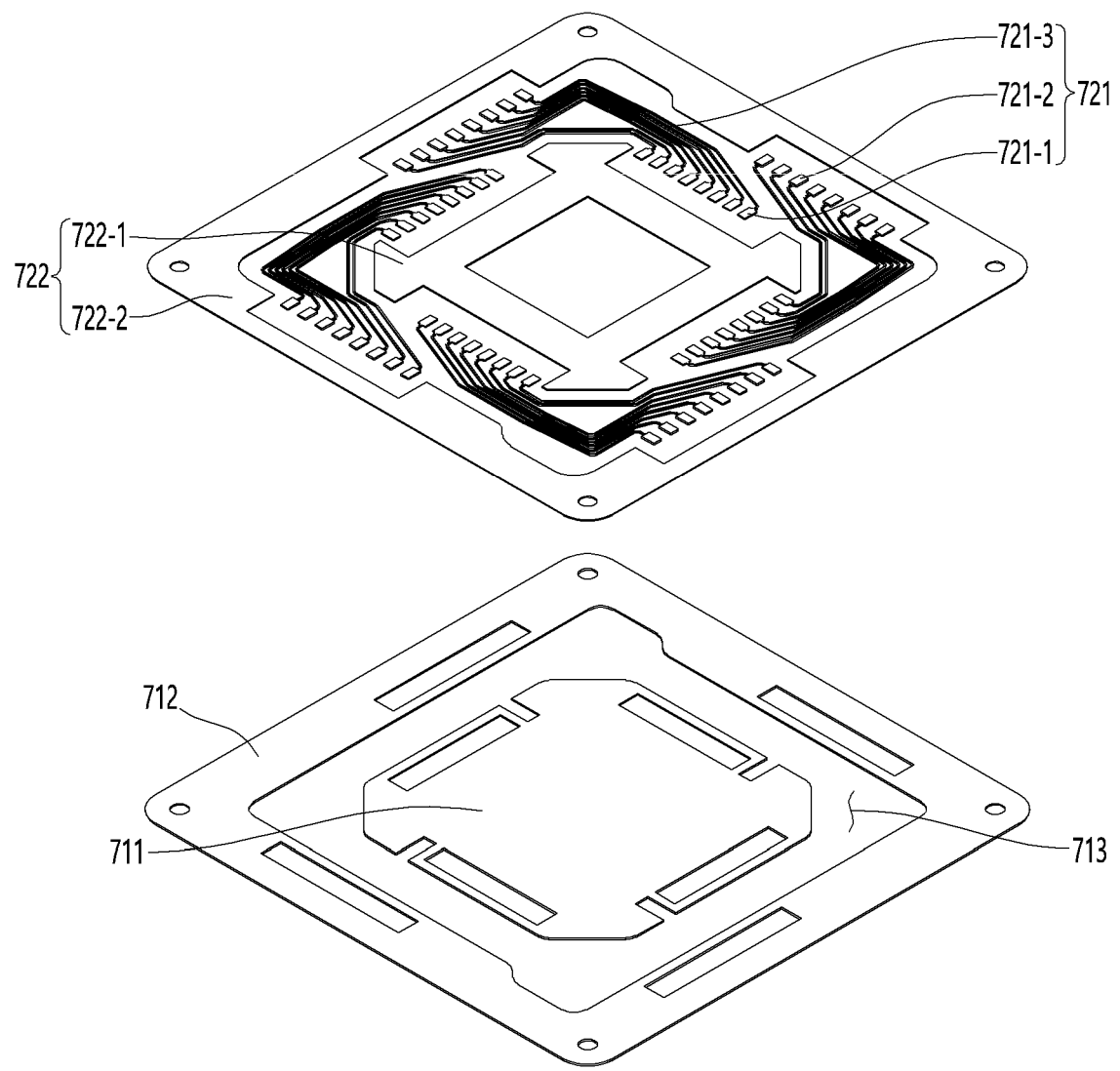
FIG. 3 is an exploded perspective view of a substrate according to an embodiment.

FIG. 3 is an exploded perspective view of a substrate according to an embodiment. The substrate 700 according to the embodiment and an electrical connection structure thereof will be described with reference to FIG. 3.

An insulating part 710 may include a first insulating region 711 and a second insulating region 712. An open region 713 may be formed between the first insulating region 711 and the second insulating region 712. For example, the open region 713 may be formed to surround the entire circumference of the first insulating region 711.

As another example, the open region 713 may be partially formed in a partial region around the first insulating region 711. When the open region 713 is partially formed, the open region 713 to be described below may vertically overlap a connecting portion 721-3 of a first pattern part 721. For example, the connecting portion 721-3 of the first pattern part 721 may be disposed to fly over the open region 713. In addition, the first insulating region 711 and the second insulating region 712 may be connected to each other as the open region 713 is not formed in a region that does not vertically overlap the connecting portion 721-3 of the first pattern part 721

The insulating part 710 may include the first insulating region 711 and the second insulating region 712 disposed with the open region 713 interposed therebetween. For example, the second insulating region 712 may be disposed to surround the outside of the first insulating region 711 with the open region 713 interposed therebetween. Each of the first insulating region 711 and the second insulating region 712 may have a rectangular shape, but the embodiment is not limited thereto. For example, the first insulating region 711 may have a circular, elliptical, or polygonal shape, and the second insulating region 712 may have a shape corresponding to a shape of the first insulating region 711.

The first insulating region 711 may correspond to the sensor part 240, and the second insulating region 712 may correspond to the main substrate 110. For example, the first insulating region 711 may overlap the sensor part 240 in an optical axis direction, and the second insulating region 712 may overlap the main substrate 110 in the optical axis direction.

The first insulating region 711 and the second insulating region 712 may be separated from each other. Here, the separation of the first insulating region 711 and the second insulating region 712 may mean that another insulating region does not exist between the first insulating region 711 and the second insulating region 712. In the embodiment, the first insulating region 711 and the second insulating region 712 may be disposed in a state of being separated from each other at positions spaced apart from each other. Accordingly, the embodiment may improve the mobility of the lens driving device. Here, the mobility of the lens driving device may include a tilting characteristic that proceeds based on the x-axis, the y-axis, and the z-axis and a shift characteristic that moves in the x-axis, the y-axis, and the z-axis direction. Specifically, in the embodiment, the first insulating region 711 connected to the sensor part 240 as the first moving part and the second insulating region 712 connected to the main substrate 110 as the fixed part are separated from each other, and thus the intensity of a driving force required to move the first moving part may be reduced, and the first insulating region 711 may be freely moved together with the first moving part without being disturbed by the second insulating region 712.

The pattern part 720 may include a conductive metal material. For example, the first pattern part 721 and the second pattern part 722 may be formed of the same conductive metal material. However, the embodiment is not limited thereto, and the first pattern part 721 and the second pattern part 722 may include different metal materials. However, in the embodiment, in order to simplify a manufacturing process, the first pattern part 721 and the second pattern part 722 are formed of the same metal material. Accordingly, in the embodiment, the first pattern part 721 and the second pattern part 722 may be simultaneously formed through a plating process or an etching process.

The pattern part 720 of the embodiment may have a plurality of layer structures. For example, the pattern part 720 may include a metal layer and a surface treatment layer. The metal layer of the pattern part 720 may include a metal layer of a rolled material constituting the pattern part 720. For example, the metal layer of the pattern part 720 may include an alloy layer of the rolled material as described above. For example, the metal layer constituting the pattern part 720 may include a copper alloy layer including copper as the rolled material.

When the surface treatment layer is not formed on a surface of the metal layer of the pattern part 720, oxidation or discoloration of an exposed surface of the pattern part 720 may occur, thereby deteriorating electrical reliability. Accordingly, in the embodiment, a surface treatment layer may be formed on the metal layer of the pattern part 720 to protect the surface of the metal layer of the pattern part 720.

The surface treatment layer may be electroless nickel electroless palladium immersion gold (ENEPIG) containing electroless nickel/electroless palladium/substituted gold. Alternatively, the surface treatment layer may include only a gold (Au) layer. Alternatively, the surface treatment layer may be electroless nickel immersion gold (ENIG) including electroless nickel/substituted gold. Alternatively, the surface treatment layer may be an organic coating layer. Preferably, in the embodiment, the surface treatment layer is configured as the organic coating layer.

Specifically, the embodiment enables the surface treatment layer to be formed by coating an organic material on the metal layer of the pattern part 720. That is, when the surface treatment layer includes nickel, it is difficult to control the concentration of phosphorus in a nickel-plating tank, and thus there is a problem that processibility is deteriorated. Further, when the concentration of phosphorus in the nickel-plating tank is not properly controlled, oxidation of nickel occurs, and accordingly, there is a problem that a black pad phenomenon in which the surface of the pattern part 720 changes to black occurs. In this case, gold (Au) plating is not properly performed on a portion where the black pad phenomenon occurs. Accordingly, when the pattern part 720 is used as a chip mounting pad, there is a problem that it is difficult to perform normal plating of the gold (Au), so that chip bonding properties are deteriorated.

In addition, when the surface treatment layer includes nickel, signal interference occurs in a high frequency band due to the magnetism of the nickel, and accordingly, there is a problem that the electrical reliability of the pattern part 720 is deteriorated. Accordingly, in the embodiment, the surface treatment layer of the pattern part 720 is formed using an organic material, not a material such as the nickel or the gold (Au).

In this case, in the embodiment, the surface treatment layer of the pattern part 720 is preferentially formed as the organic coating layer instead of the metal layer containing nickel, so that the electrical characteristics of the pattern part 720 may be improved.

The first pattern part 721 may electrically connect the main substrate 110 and the sensor part 240 and may allow the first moving part 200 to move relative to the fixed part 100. To this end, the first pattern part 721 may have elasticity. The first pattern part 721 may include an alloy layer formed of an alloy including copper (Cu). For example, the first pattern part 721 may be a binary alloy including at least one of at least one of titanium (Ti), nickel (Ni), tin (Sn), beryllium (Be), and cobalt (Co) in copper (Cu), and may be a ternary alloy including at least two of them. For example, the first pattern part 721 may include an alloy layer including nickel and copper.

However, the embodiment is not limited thereto, and the first pattern part 721 may include an alloy such as iron (Fe), nickel (Ni), zinc, or the like that has good electrical characteristics while having an elastic force that can serve as a spring.

Specifically, the first pattern part 721 may have a characteristic value of a certain level or more that is not broken even when the first moving part 200 moves.

For example, the first pattern part 721 may have a tensile strength of 500 N/mm2 or more, 800 N/mm2 or more, 1000 N/mm2, or 1400 N/mm2 or more. For example, the first pattern part 721 may have a 0.2% offset yield strength of 500 N/mm2 or more, 800 N/mm2 or more, 1000 N/mm2 or more, or 1400 N/mm2 or more.

Meanwhile, the first pattern part 721 includes a surface in contact with the first insulating region 711 and the second insulating region 712. For example, a part of a lower surface of a first terminal portion 721-1 of the first pattern part 721 and a part of the second terminal portion 721-2 of a first pattern part 721 may be in contact with the first insulating region 711 and the second insulating region 712. In this case, physical and/or electrical reliability of the substrate 700 may be determined according to a roughness of the contacting surface.

In this case, when the contacting surface has a centerline average roughness Ra in a range of 0.025 µm to 0.035 µm and/or a 10-point average roughness in a range of 0.3 µm to 0.5 µm, a problem may occur that the first pattern part 721 is detached from the insulating part 710.

In an embodiment, a surface of the first pattern part 721 may have the centerline average roughness Ra in a range of 0.05 µm to 0.5 µm, 0.05 µm to 0.2 µm, or 0.08 µm to 0.15 µm. For example, in the embodiment, the surface of the first pattern part 721 may have the 10-point average roughness Rz in a range of 0.6 to 5 µm, 0.7 to 3.0 µm, or 1.0 to 2.5 µm.

The first pattern part 721 may include the first terminal portion 721-1 connected to a pad (not shown) of the sensor part 240, the second terminal portion 721-2 connected to a pad (not shown) of the main substrate 110, and the connecting portion 721-3 connecting the first terminal portion 721-1 and the second terminal portion 721-2. In this case, the first terminal portion 721-1, the second terminal portion 721-2, and the connecting portion 721-3 are only distinguished for description of the configuration, and substantially, they may be formed integrally with each other.

The first terminal portion 721-1 may be formed in each of first outer side regions of the first insulating region 711. In addition, at least a part of the first terminal portion 721-1 may be exposed through each of first terminal opening portions of the first insulating region 711.

Meanwhile, the connecting portion 721-3 may connect between the first terminal portion 721-1 and the second terminal portion 721-2.

In the first insulating region 711 and the second insulating region 712, the connecting portion 721-3 may not have a structure in which the first terminal portion and the second terminal portion disposed in side regions facing each other are connected to each other, but the connecting portion 721-3 may have a structure in which the first terminal portion and the second terminal portion respectively disposed in side regions that do not face each other are connected to each other.

The connecting portion 721-3 may not overlap the insulating part 710 in the optical axis direction. For example, the connecting portion 721-3 may be disposed to fly over the open region 713 0 of the insulating part 710. Here, the flying over may refer that the connecting portion 721-3 is not in contact with other configurations of the substrate on the open region 713.

Accordingly, the embodiment may improve mobility of the first moving part 200 by the connecting portion 721-3. That is, the embodiment may improve the elasticity of the connecting portion 721-3 to improve the mobility of the first moving part 200.

The connecting portion 721-3 of the embodiment includes a plurality of connecting portions connecting between a plurality of first terminal portions 721-1 and a plurality of second terminal portions 721-2. In addition, each of the plurality of connecting portions includes a bent portion disposed at different corners of the open region 713. In this case, the bent portions of the plurality of connecting portions may be bent and extended in the same direction as each other as a rotational direction. Accordingly, according to the embodiment, the reliability of the connecting portion 721-3 may be improved, and further, the mobility of the first moving part 200 by the lens driving device may be improved.

For example, when the bent portions of the plurality of connecting portions are bent in different directions as the rotational direction, when the first moving part 200 moves, a force acting on respective connecting portions may appear different from each other, and accordingly, the mobility of the first moving part 200 may be deteriorated. Further, when the bent portions of the plurality of connecting portions are bent in different directions as the rotational direction, force may be concentrated on a specific connecting portion among the respective connecting portions, and accordingly, a problem may occur that the connecting portion on which the force is concentrated is broken earlier than the other connecting portions.

On the other hand, in the embodiment, when the first moving part 200 moves, the force acting on each of the connecting portions may be uniformly distributed by bending the bent portions of the plurality of connecting portions in the same direction as each other as the rotational direction. Accordingly, the mobility of the first moving part 200 may be improved. Further, the embodiment may solve the problem that the specific connecting portion is broken first among the respective connecting portions by uniformly distributing the force acting on the respective connecting portions as described above. Furthermore, even though a problem occurs that the connecting portion is broken, all of the connecting portions are broken at the same time, so that the first moving part 200 may have characteristics strong against tilting.

The connecting portion 721-3 may not be supported by the first insulating region 711 and the second insulating region 712. For example, the connecting portion 721-3 may include a portion that does not overlap the first insulating region 711 and the second insulating region 712 in the optical axis direction. In particular, the bent portion of the connecting portion 721-3 may not overlap the first insulating region 711 and the second insulating region 712 in the optical axis direction.

Meanwhile, in the embodiment, the number of the first terminal portion 721-1, the second terminal portion 721-2, and the connecting portion 721-3 may be the same. For example, the first terminal portion 721-1, the second terminal portion 721-2, and the connecting portion 721-3 may be connected to each other in 1:1 manner. In the embodiment, the number of the first terminal portions 721-1, the number of the second terminal portions 721-2, and the number of the connecting portion 721-3 are made equal to each other, and thus the mobility of the first moving part 200 may be improved. For example, when the first terminal portion, the second terminal portion, and the connecting portion are intensively disposed in a specific region, or the number of the first terminal portion, the second terminal portion, and the connecting portion disposed in the specific region is larger than that of another region, a difference between an amount of movement in a intensively disposed region and an amount of movement in a less disposed portion may occur, and accordingly, the mobility of the first moving part 200 may be deteriorated. Unlike this, in the embodiment, the first terminal portion 721-1, the second terminal portion 721-2, and the connecting portion 721-3 are disposed to be distributed in four first side regions of the first insulating region 711, four second side regions of the second insulating region 712, and four corners of the open region 713, and thus the mobility of the first moving part 200 may be improved, thereby improving operational reliability.

Meanwhile, the total number of the first terminal portions 721-1, the total number of the second terminal portions 721-2, and the total number of the connecting portion 721-3 may correspond to the number of channels of signals exchanged between the main substrate 110 and the sensor part 240. For example, the number of communication channels between the main substrate 110 and the sensor part 240 may be 32, but the embodiment is not limited thereto.

A thickness of the first pattern part 721 may be 20 μm to 80 μm. For example, a thickness of the first pattern part 721 may be 25 μm to 75 μm. For example, a thickness of the first pattern part 721 may be 30 μm to 70 μm.

When the thickness of the first pattern part 721 is less than 20 μm, a problem may occur that the first pattern part 721 is easily broken when the first moving part 200 is moved. In addition, when the thickness of the first pattern part 721 is greater than 80 μm, an elastic force of the connecting portion 721-3 may be lowered, thereby hindering the mobility of the first moving part 200. For example, when the thickness of the first pattern part 721 is greater than 80 μm, a driving force required to move the first moving part 200 may increase due to the decrease in the elastic force, thereby increasing power consumption. Accordingly, in the embodiment, the thickness of the first pattern part 721 may satisfy a range of 35 μm±5 μm so that the first moving part 200 may be stably moved.

A length of the connecting portion 721-3 may be at least 1.5 times a width of the open region 713. In addition, the length of the connecting portion 721-3 may be 20 times or less the width of the open region 713. In this case, the width of the open region 713 may be 1.5 mm. When the length of the connecting portion 721-3 is smaller than 1.5 times the width of the open region 713, the mobility of the first moving part 200 may be deteriorated due to the decrease in the elastic force of the connecting portion 721-3. In addition, when the length of the connecting portion 721-3 is greater than 20 times the width of the open region 713, as a signal transmission distance is increased by the connecting portion 721-3, a resistance increases, and accordingly, a signal transmitted through the connecting portion 721-3 may contain noise.

Meanwhile, the main substrate 110 is electrically connected to the first terminal portion 721-1 of the substrate 700, and the sensor part 240 is electrically connected to the second terminal portion 721-2 of the first pattern part 721 of the substrate 700. In this case, the connecting portion 721-3 may be provided between the first terminal portion 721-1 and the second terminal portion 721-2 to electrically connect them while having the elastic force. Accordingly, the main substrate 110 and the sensor part 240 may be electrically connected to each other. The first moving part 200 constituting the sensor part 240 may be rotatable based on the x-axis or the y-axis by the elastic force of the connecting portion 721-3. Meanwhile, the sensor part 241 may be electrically connected to the third driving member 330.

Figure 4:
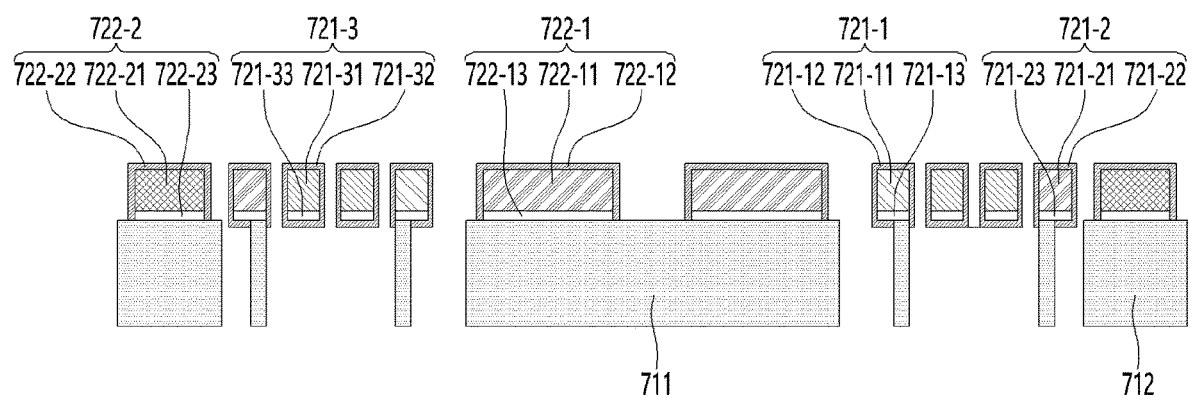
FIG. 4 is a view for describing a layer structure of a circuit board according to an embodiment.

FIG. 4 is a view for describing a layer structure of a circuit board according to an embodiment.

Referring to FIG. 4, the pattern part 720 may include the first pattern part 721 and the second pattern part 722.

The first pattern part 721 may include the first terminal portion 721-1, the second terminal portion 721-2, and the connecting portion 721-3. The second pattern part 722 may be a reinforcing pattern part and/or a dummy pattern part. The second pattern part 722 may include a 2-1 pattern part 722-1 and a 2-2 pattern part 722-2.

The first pattern part 721 and the second pattern part 722 may be a pattern formed at the same time and may have the same material and the same layer structure as each other. However, the embodiment is not limited thereto, and the first pattern part 721 and the second pattern part 722 may have different layer structures.

The first terminal portion 721-1, the second terminal portion 721-2, the connecting portion 721-3, the 2-1 pattern part 722-1, and the 2-2 pattern part 722-2 may include a metal layer and a surface treatment layer, respectively.

The first terminal portion 721-1 of the first pattern part 721 may include a first metal layer 721-11 disposed on the first insulating region 711. In addition, the first terminal portion 721-1 may include a surface treatment layer 721-12 disposed on the first metal layer 721-11.

In addition, the second terminal portion 721-2 of the first pattern part 721 may include the first metal layer 721-21 and the surface treatment layer 721-22. In addition, the connecting portion 721-3 of the first pattern part 721 may include a first metal layer 721-31 and a surface treatment layer 721-32. In addition, the 2-1 pattern part 722-1 may include a first metal layer 722-11 and a surface treatment layer 722-12. In addition, the 2-2 pattern part 722-2 may include a first metal layer 722-21 and a surface treatment layer 722-22.

The first metal layers 721-11, 721-21, 721-31, 722-11, and 722-21 of each of the first pattern part 721 and the second pattern part 722 may be an alloy layer made of a rolled material. For example, the first metal layers 721-11, 721-21, 721-31, 722-11, and 722-21 of each of the first pattern part 721 and the second pattern part 722 may be a copper alloy layer made of a rolled material. However, a surface roughness of the first metal layer made of the rolled material may be relatively low, and thus a bonding strength with the insulating part may be deteriorated. Accordingly, the metal layers of the first pattern part 721 and the second pattern part 722 may further include third metal layers 721-13, 721-23, 721-33, 722-13, and 722-23. The third metal layers 721-13, 721-23, 721-33, 722-13, and 722-23 may be disposed on a lower surface of the first metal layers 721-11, 721-21, 721-31, 722-11, and 722-21. The third metal layers 721-13, 721-23, 721-33, 722-13, and 722-23 may function to improve adhesion the first metal layers 721-11, 721-21, 721-31, 722-11, and 722-21 and the insulating part.

Meanwhile, the third metal layers 721-13, 721-23, 721-33, 722-13, and 722-23 may be selectively omitted. Accordingly, in an embodiment, each of the metal layers of the first pattern part 721 and the second pattern part 722 may include only the first metal layer 721-11, 721-21, 721-31, 722-11, and 722-21. In addition, in another embodiment, each of the metal layers of the first pattern part 721 and the second pattern part 722 may include the first metal layers 721-11, 721-21, 721-31, 722-11, and 722-21 and the third metal layers 721-13, 721-23, 721-33, 722-13, and 722-23. Accordingly, the metal layer described below may include only the first metal layers 721-11, 721-21, 721-31, 722-11, and 722-21, and unlike this, the metal layer described below may include all of the first metal layers 721-11, 721-21, 721-31, 722-11, and 722-21 and the third metal layers 721-13, 721-23, 721-33, 722-13, and 722-23.

Meanwhile, the first pattern part 721 and the second pattern part 722 may include surface treatment layers 721-12, 721-22, 721-32, 722-12, and 722-2. The surface treatment layers 721-12, 721-22, 721-32, 722-12, and 722-2 may be disposed on the first metal layers 721-11, 721-21, 721-31, 722-11, and 722-21. In addition, the surface treatment layers 721-12, 721-22, 721-32, 722-12, and 722-2 may be disposed on the first metal layers 721-11, 721-21, 721-31, 722-11, and 722-21 and the third metal layers 721-13, 721-23, 721-33, 722-13, and 722-23. The surface treatment layers 721-12, 721-22, 721-32, 722-12, and 722-2 may include an organic material.

The surface treatment layers 721-12, 721-22, 721-32, 722-12, and 722-2 may include an organic material having no conductivity. However, the embodiment is not limited thereto, and the surface treatment layers 721-12, 721-22, 721-32, 722-12, and 722-2 may include any one of an organic material, an inorganic material, and a composite thereof that have low electrical conductivity.

In this case, the organic material constituting the surface treatment layers 721-12, 721-22, 721-32, 722-12, and 722-2 as described above may have a relative permittivity ε. In this case, the relative permittivity ε may affect a transmission speed v of a signal transmitted through the pattern part 720. For example, the signal transmission speed v may be determined by the following Equation 1.

$$v = K * C \frac{1}{\sqrt{\varepsilon r}}$$ [Equation 1]

Here, v corresponds to the signal transmission speed, ε corresponds to the relative permittivity of a material constituting the pattern part 720, C corresponds to a speed of light, and K is an integer.

Here, the relative permittivity ε of the surface treatment layers 721-12, 721-22, 721-32, 722-12, and 722-2 may be 3.24. This may be a value significantly smaller than a relative permittivity ε of the nickel or gold (Au). For example, the relative permittivity ε of the nickel or gold (Au) may be 4 or more. Accordingly, in the embodiment, the signal transmission speed v may be improved by including the organic material in the surface treatment layers 721-12, 721-22, 721-32, 722-12, and 722-2. Accordingly, in the embodiment, product reliability of the circuit board may be improved.

In addition, in the embodiment, thermal conductivity of the organic material constituting the surface treatment layers 721-12, 721-22, 721-32, 722-12, and 722-2 may be greater than that of nickel and copper. Accordingly, in the embodiment, thermal conductivity of the pattern part 720 may be increased. Here, recently, a product such as a camera module, heat dissipation characteristics have emerged as a major problem. That is, various components included in the camera module are vulnerable to heat dissipation, and accordingly, efforts are being made to improve the heat dissipation characteristics. In this case, in the embodiment, the thermal conductivity of the pattern part 720 may be increased by forming the surface treatment layers 721-12, 721-22, 721-32, 722-12, and 722-2 using an organic material having high thermal conductivity. Accordingly, the embodiment may improve the heat dissipation characteristics of the circuit board and the camera module to which the circuit board is applied.

In addition, in the embodiment, the pattern part 720 included in the circuit board is one of components of the first moving part. That is, the connecting portion 721-3 constituting the pattern part 720 may move in a plurality of directions during operation of the camera module. For example, the connecting portion 721-3 is shifted or tilted in at least one direction of an X-axis, a Y-axis, and a Z-axis together with an image sensor (not shown) constituting the sensor part 240 in order to auto-focus the camera module or inhibit hand shake. In this case, the pattern part 720 included in the circuit board may be in contact with other components during the moving operation as described above. In addition, when the pattern part 720 is in contact with other components, a problem may occur in electrical reliability of the pattern part 720. In this case, in the embodiment, by forming the surface treatment layers 721-12, 721-22, 721-32, 722-12, and 722-2 through the organic coating of the pattern part 720 as described above, it is possible to improve the electrical reliability. For example, in the embodiment, the surface treatment layers 721-12, 721-22, 721-32, 722-12, and 722-2 have electrical conductivity lower than that of conventional nickel or gold (Au). Accordingly, in the embodiment, when the pattern part 720 is in contact with other components, the surface treatment layers 721-12, 721-22, 721-32, 722-12, and 722-2 may perform an insulating function, thereby improving the electrical reliability of the circuit board. In addition, in the embodiment, as the surface treatment layers 721-12, 721-22, 721-32, 722-12, and 722-2 of the pattern part 720 are formed through the organic coating, the plating process may be simplified compared to the conventional surface treatment layer, and further, costs of the plating process may be reduced.

Meanwhile, the surface treatment layers 721-12, 721-22, 721-32, 722-12, and 722-2 may be provided on an outer surface that is not in contact with the insulating part among outer surfaces of the first metal layers 721-11, 721-21, 721-31, 722-11, and 722-21 and/or the third metal layer 721-13, 721-23, 721-33, 722-13, and 722-23.

Upper and side surfaces among the outer surfaces of the metal layer of the first terminal portion 721-1 may not be in contact with the first insulating region 711. Therefore, the surface treatment layer 721-12 of the first terminal portion 721-1 may be entirely provided on the upper surface and the side surface of the metal layer of the first terminal portion 721-1. In addition, a lower surface of the outer surfaces of the metal layer of the first terminal portion 721-1 may be partially in contact with the first insulating region 711. Therefore, a part of the lower surface of the metal layer of the first terminal portion 721-1 may be in contact with the first insulating region 711, and the remaining part may be in contact with the surface treatment layer 721-12.

Upper and side surfaces among the outer surfaces of the metal layer of the second terminal portion 721-2 may not be in contact with the second insulating region 712. Therefore, the surface treatment layer 721-22 of the second terminal portion 721-2 may be entirely provided on the upper surface and the side surface of the metal layer of the second terminal portion 721-2. In addition, a lower surface of the outer surface of the metal layer of the second terminal portion 721-2 may be partially in contact with the second insulating region 712. Therefore, a part of the lower surface of the metal layer of the second terminal portion 721-2 may be in contact with the second insulating region 712, and the remaining part may be in contact with the surface treatment layer 721-22.

The outer surface of the metal layer of the connecting portion 721-3 may not be entirely in contact with the insulating part 710. Accordingly, the upper surface, the side surface, and the lower surface of the outer surface of the metal layer of the connecting portion 721-3 may be entirely covered by the surface treatment layer 721-32. Therefore, the surface treatment layer 721-32 of the connecting portion 721-3 may also perform an insulating function of the connecting portion 721-3 when the image sensor is moved, thereby improving the electrical reliability of the circuit board.

Meanwhile, lower surfaces among outer surfaces of each of the 2-1 pattern part 722-1 and the 2-2 pattern part 722-2 may be entirely in contact with the insulating part 710. In addition, upper surfaces and side surfaces among the outer surfaces of each of the 2-1 pattern part 722-1 and the 2-2 pattern part 722-2 may not be in contact with the insulating part 710. Therefore, the surface treatment layers 722-12 and 722-22 of the 2-1 pattern part 722-1 and the 2-2 pattern part 722-2 may be in contact with the side surfaces and upper surfaces of the 2-1 pattern part 722-1 and the 2-2 pattern part 722-2 without being in contact with the lower surfaces of the 2-1 pattern part 722-1 and the 2-2 pattern part 722-2.

The surface treatment layers 721-12, 721-22, 721-32, 722-12, and 722-2 may have a thickness in a range of 0.1 µm to 10 µm. For example, the surface treatment layers 721-12, 721-22, 721-32, 722-12, and 722-2 may have a thickness in a range of 0.15 µm to 8 µm. For example, the surface treatment layers 721-12, 721-22, 721-32, 722-12, and 722-2 may have a thickness of 0.2 µm to 5 µm. When the thickness of the surface treatment layers 721-12, 721-22, 721-32, 722-12, and 722-2 is smaller than 0.1 µm, there is a problem that a uniform surface treatment layer may not be formed on the surface of the pattern part 720. That is, when the thickness of the surface treatment layers 721-12, 721-22, 721-32, 722-12, and 722-2 is smaller than 0.1 µm, a problem that the surface treatment layer may not be disposed on some surfaces of the pattern part 720 may occur, and a problem that oxidation occurs in a region where the surface treatment layer is not disposed may occur. In addition, when the thickness of the surface treatment layers 721-12, 721-22, 721-32, 722-12, and 722-2 exceeds a range of 10 µm, there is a problem that as the thickness of the pattern part 720 increases, a resistance increases, and thus signal loss increases. Further, when the thickness of the surface treatment layers 721-12, 721-22, 721-32, 722-12, and 722-2 exceeds 10 µm, there is a problem that costs of coating for forming the surface treatment layer increases.

Meanwhile, when the metal layer of the pattern part includes only the first metal layer 721-11, 721-21, 721-31, 722-11, and 722-21 and the third metal layer 721-13, 721-23, 721-33, 722-13 and 722-23, the electrical characteristics of the pattern part may be deteriorated. Therefore, the metal layer of the pattern part of the embodiment further includes a second metal layer in contact with at least a part of the outer surfaces of the first metal layer 721-11, 721-21, 721-31, 722-11, and 722-21. In addition, the embodiment may be classified into various embodiments according to an arrangement structure of the second metal layer.

First, a problem when the metal layer of the pattern part does not include the second metal layer will be described.

Figure 5:
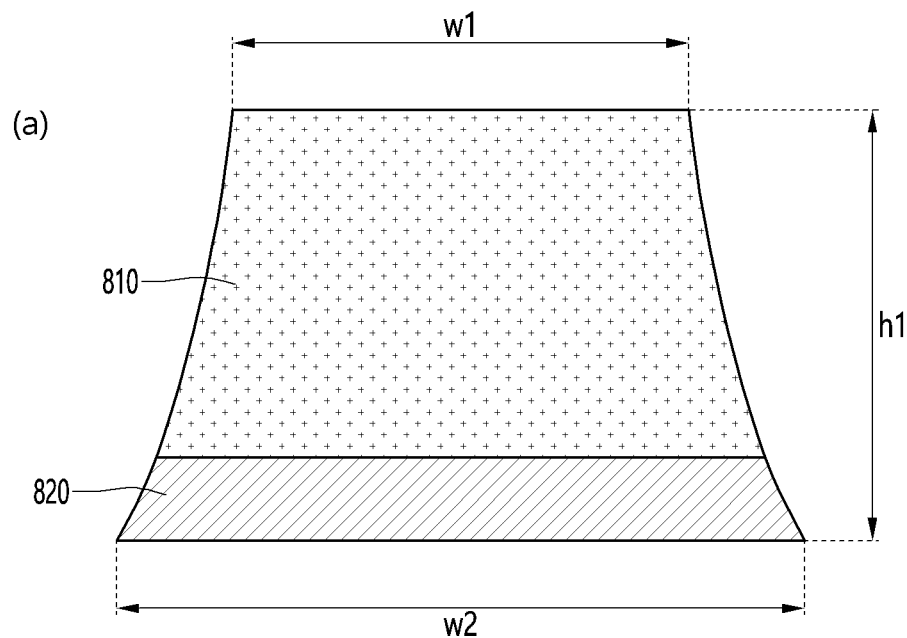
FIG. 5 is a view for describing a layer structure of a metal layer of a pattern part of Comparative Example of FIG. 4.
Figure 5:
Figure 6:
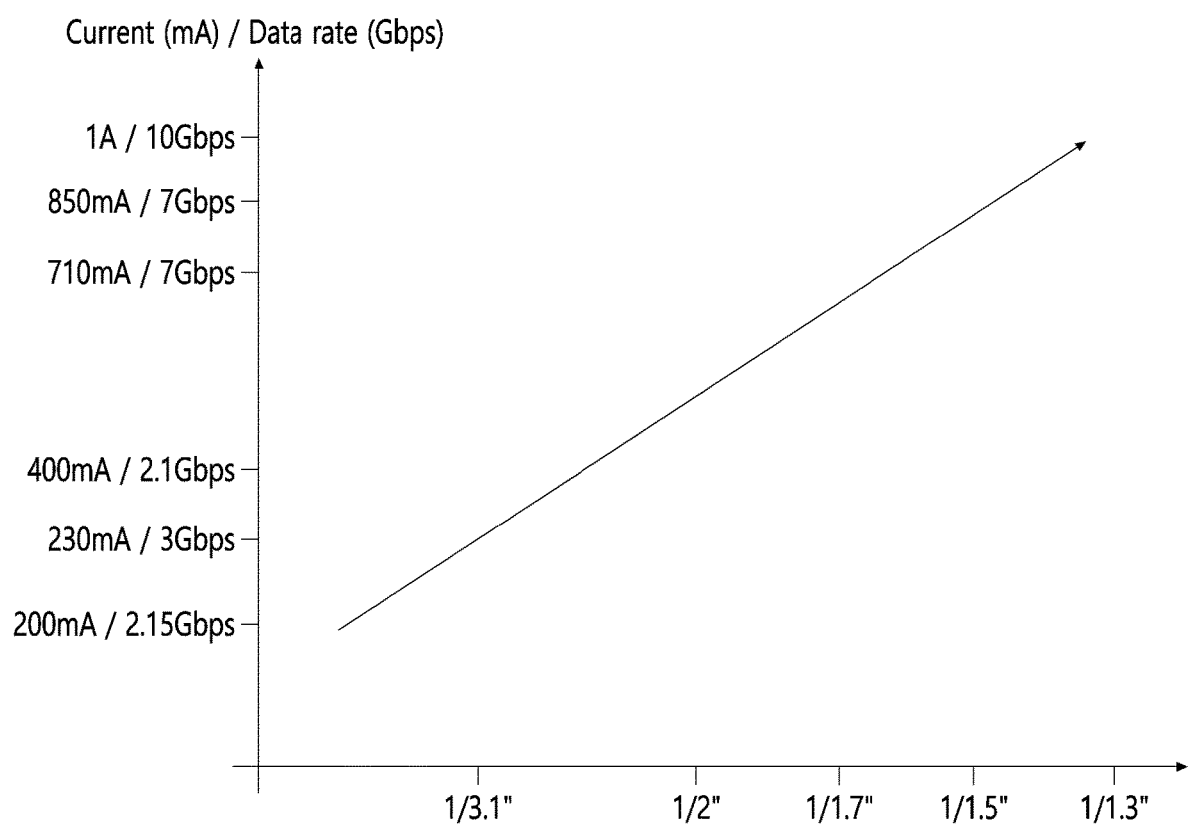
FIG. 6 is a view showing an allowable current and communication speed of a pattern part required according to a size of an image sensor.

FIG. 5 is a view for describing a layer structure of a metal layer of a pattern part of Comparative Example of FIG. 4, and FIG. 6 is a view showing an allowable current and communication speed of a pattern part required according to a size of the image sensor.

Referring to FIGS. 5 and 6, the metal layer of the pattern part of Comparative Example includes a first metal layer 810 and a third metal layer 820. The first metal layer 810 may refer to the first metal layers 721-11, 721-21, 721-31, 722-11, and 722-21. In addition, the third metal layer 820 may refer to the third metal layers 721-13, 721-23, 721-33, 722-13, and 722-23.

FIG. 5A is a view showing a vertical cross-sectional shape of the pattern part in Comparative Example, FIG. 5B is a view showing an optical microscope photograph of a vertical cross-section of a pattern part in an actual product according to Comparative Example.

Characteristics of the first metal layer 810 are shown in Table 1 below.

TABLE 1

| Category | Characteristic |
|---|---|
| composition (wt %) | Ti 2.9 wt %~3.5 wt % |
| Tensile strength [MPa] | 1400 (1300-1600) |
| Yield strength [MPa] | 1300 |
| Elongation [%] | 1.5 |
| Vickers hardness [Hv] | 400 (350-450) |
| Young's modulus [Pa] | 127k |
| Density [g/cm$^3$] | 8.7 |
| Electrical conductivity | 10% IACS |
| Specific resistance [nΩ · m] | 172 |
| Thermal conductivity [W/m · k] | 47 |

The first metal layer 810 may have very low electrical conductivity. For example, as shown in Table 1, the first metal layer 810 of Comparative Example has a level of 10% of electrical conductivity of pure copper. Accordingly, the first metal layer 810 in Comparative Example may not be applied to a high-resolution image sensor due to low electrical conductivity. That is, the allowable current and the signal communication speed of the pattern part used for signal transmission are proportional to the electrical conductivity, and accordingly, the first metal layer 810 has low electrical conductivity, so that the electrical characteristics including the allowable current and the communication speed may be deteriorated.

For example, referring to FIG. 6, it can be seen that an allowable current and communication speed (e.g., data transfer rate: data rate) required as the size of the image sensor increases increase.

In addition, as the first metal layer 810 has the low electrical conductivity, a specific resistance value in a unit area (3 cm*3 cm) is 17.29 µΩ*cm level, and it can be seen that the specific resistance value of the first metal layer 810 is very high level compared to a specific resistance value of pure copper.

Meanwhile, when etching for pattern formation is performed in a state in which the first metal layer 810 and the third metal layer 820 are formed, an uppermost portion of the first metal layer 810 is etched preferentially, and finally the third metal layer 820 is etched. Accordingly, in Comparative Example, since the third metal layer 820 and the first metal layer 810 have a similar etching rate to each other, the etching is performed the most at an upper portion of the first metal layer 810, and the etching is performed the least at a lower portion of the third metal layer 820.

Accordingly, as shown in FIGS. 5 and 6, the pattern part 720 of Comparative Example may have a slope in which a width gradually decreases from an upper surface toward a lower surface thereof.

In this case, it was confirmed that an etching factor of the pattern part 720 in Comparative Example was 1.810 level.

The etching factor may be calculated by Equation 1 below.

$$\text{Etching factor} = h1/(w2-w1) \quad \text{[Equation 1]}$$

Here, h1 is the thickness of the pattern part 720, w2 refers to a width of the upper surface of the pattern part 720, and w1 refers to a width of the lower surface of the pattern part 720. In addition, as a difference between the width of the upper surface and the lower surface of the pattern part 720 according to the thickness h1 of the pattern part 720 is large, the etching factor has a lower value.

For example, the thickness h1 of the pattern part 720 in Comparative Example was 34.31 µm, the width w1 of the upper surface of the pattern part 720 was 46.27 µm, and the width w2 of the lower surface was 58.81 µm. In addition, it was confirmed that the etching factor of the pattern part 720 in Comparative Example had a level of 1.810. Meanwhile, when the etching factor is low, the difference between the width of the upper surface of the pattern part 720 and the width of the lower surface of the pattern part 720 is large. In addition, when the difference between the width of the upper surface and the lower surface of the pattern part 720 is large, there is a problem that the loss of a signal transmitted through the pattern part 720 increases. For example, a general signal has a property that a signal flows along the surface of the pattern part, and when the difference between the width of the upper surface of the pattern part 720 and the width of the lower surface of the pattern part 720 is large as described above, there is a characteristic that the signal transmission characteristic is lowered.

Accordingly, the embodiment is directed to providing a layer structure of a new pattern part 720 capable of increasing the electrical conductivity of the pattern part 720, lowering the specific resistance value, and increasing the etching factor.

Figure 7:
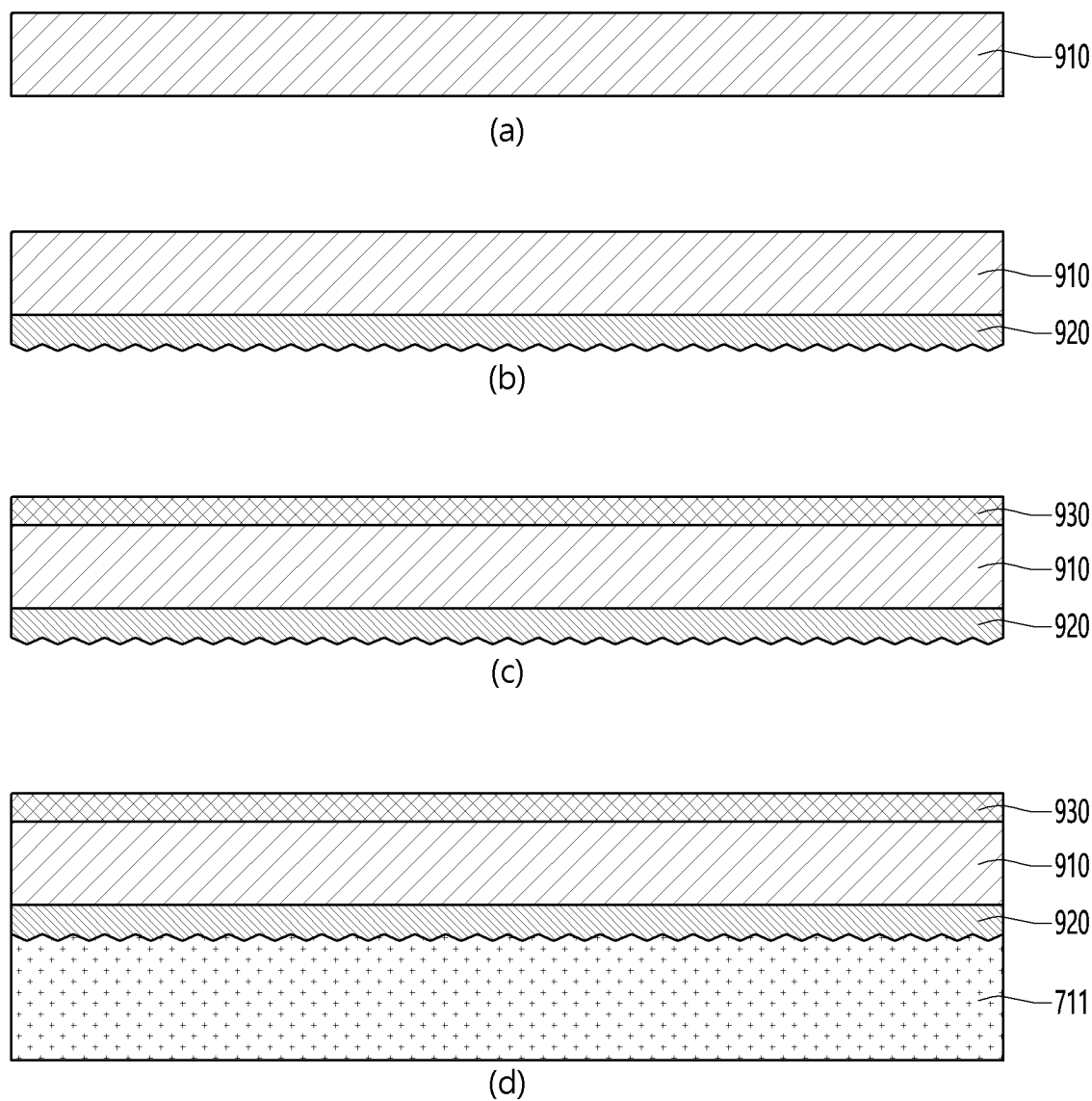
FIG. 7 is a view for describing a material used for manufacturing a substrate according to an embodiment.

FIG. 7 is a view for describing a material used for manufacturing a substrate according to an embodiment.

Referring to FIG. 7, in the embodiment, as shown in FIG. 7A, the first metal layer 910 may be prepared using the pattern part 720 as a basic material for forming the pattern part 720 of the substrate 700.

Thereafter, as shown in FIG. 7B, in the embodiment, a third metal layer 920 may be formed on a lower surface of the first metal layer 910 in contact with the insulating part 711. The third metal layer 920 may have a thickness in a range of 2 µm to 10 µm. For example, the third metal layer 920 may have the thickness in a range of 3 µm to 9 µm. For example, the third metal layer 920 may have the thickness in a range of 3.5 µm to 8.5 µm.

When the thickness of the third metal layer 920 is less than 2 µm, a roughness of a certain level or more may not be provided to the lower surface of the first metal layer 910, and accordingly, a bonding strength between the first metal layer 910 and the insulating part 710 may be deteriorated.

When the thickness of the third metal layer 920 is greater than 10 µm, the overall thickness of the pattern part 720 may increase, and further, the overall thickness of the substrate may increase. In addition, when the thickness of the third metal layer 920 is greater than 10 µm, there is a limit to reducing a line width of the pattern part 720, and accordingly, it is difficult to form the pattern part 720.

A lower surface of the third metal layer 920 may have the centerline average roughness Ra in a range of 0.05 µm to 0.5 µm. For example, the lower surface of the third metal layer 920 in the embodiment may have the centerline average roughness Ra in a range of 0.05 µm to 0.2 µm. For example, the lower surface of the third metal layer 920 in the embodiment may have the centerline average roughness Ra in a range of 0.08 µm to 0.15 µm. For example, the lower surface of the third metal layer 920 in the embodiment may have the 10-point average roughness Rz in a range of 0.6 to 5 µm. For example, the lower surface of the third metal layer 920 in the embodiment may have the 10-point average roughness Rz in a range of 0.7 to 3.0 µm. For example, the lower surface of the third metal layer 920 may have the 10-point average roughness Rz in a range of 1.0 to 2.5 µm.

As shown in FIG. 7C, in the embodiment, a second metal layer 930 is formed on an upper surface of the first metal layer 910. The second metal layer 930 may be formed on the upper surface of the first metal layer 910 through an electroless plating process, and unlike this, the second metal layer 930 may be formed through a coating process, and unlike this, the second metal layer 930 may be formed through a deposition process.

The second metal layer 930 may include a metal material having high electrical conductivity. For example, the second metal layer 930 may include one metal material selected from among copper (Cu), aluminum (Al), and silver (Ag) having high electrical conductivity. Alternatively, the second metal layer 930 may include a conductive polymer material having high electrical conductivity.

The second metal layer 930 may have a thickness in a range of 1 µm to 15 µm and may be disposed on the upper surface of the first metal layer 910. For example, the second metal layer 930 may have the thickness in a range of 2 µm to 13 µm and may be disposed on the upper surface of the first metal layer 910. For example, the second metal layer 930 may have the thickness in a range of 3 µm to 12 µm and may be disposed on the upper surface of the first metal layer 910.

When the thickness of the second metal layer 930 is less than 1 µm, a degree of increase in the electrical conductivity or a degree of decrease in the specific resistance value of the pattern part 720 by the second metal layer 930 may be insignificant, and accordingly, the pattern part 720 may be difficult to apply to a camera module that requires a high allowable current and a high communication speed. In addition, when the thickness of the second metal layer 930 is less than 1 µm, the etching factor of the pattern part 720 according to the embodiment may have a level similar to that of Comparative Example, thereby increasing the signal transmission loss of the pattern part 720.

When the thickness of the second metal layer 930 exceeds 15 µm, the overall thickness of the pattern part 720 increases according to the thickness of the second metal layer 930, thereby increasing the overall thickness of the circuit board. In addition, when the thickness of the second metal layer 930 exceeds 15 µm, it may be difficult to make the pattern part 720 fine. In addition, when the thickness of the second metal layer 930 exceeds 15 µm, it was confirmed that a degree of reduction in the etching factor or a degree of reduction in the specific resistance value of the pattern part 720 was insignificant, and further, it was also confirmed that the etching factor rather increased.

In this case, when the second metal layer 930 is formed by a plating process, the second metal layer 930 may be formed by a plating method different from that of the third metal layer 920. For example, the third metal layer 920, in order to provide roughness of a certain level or more as described above, may be formed rapidly by changing a voltage value to a high value. Unlike this, the second metal layer 930 may be formed slowly while the voltage value is fixed, and thus a surface roughness of an upper surface of the second metal layer 930 may have a very low value. For example, the surface roughness of the upper surface of the second metal layer 930 is lower than the surface roughness of the lower surface of the third metal layer 920. That is, when the second metal layer 930 is plated in the same manner as the third metal layer 920, the upper surface of the second metal layer 930 will also have a surface roughness of a certain level or more. In this case, when the surface roughness of the upper surface of the second metal layer 930 is large, a skin effect occurs according to characteristics of the signal having the property of flowing along the surface, and thus the signal transmission loss may be increased. Accordingly, in the embodiment, the upper surface of the second metal layer 930 has a low surface roughness, and thus a signal is transmitted along a surface of the second metal layer 930, thereby improving the signal transmission characteristics.

Next, in the embodiment, as shown in FIG. 7D, a metal layer in which the second metal layer 930, the first metal layer 910, and the third metal layer 920 are sequentially stacked from the top may be bonded on the insulating part 711. In this case, the insulating part 711 may be in contact with the lower surface of the third metal layer 920, and bonding strength between the insulating part and the metal layer may be improved due to a high surface roughness of the third metal layer 920.

Figure 8:
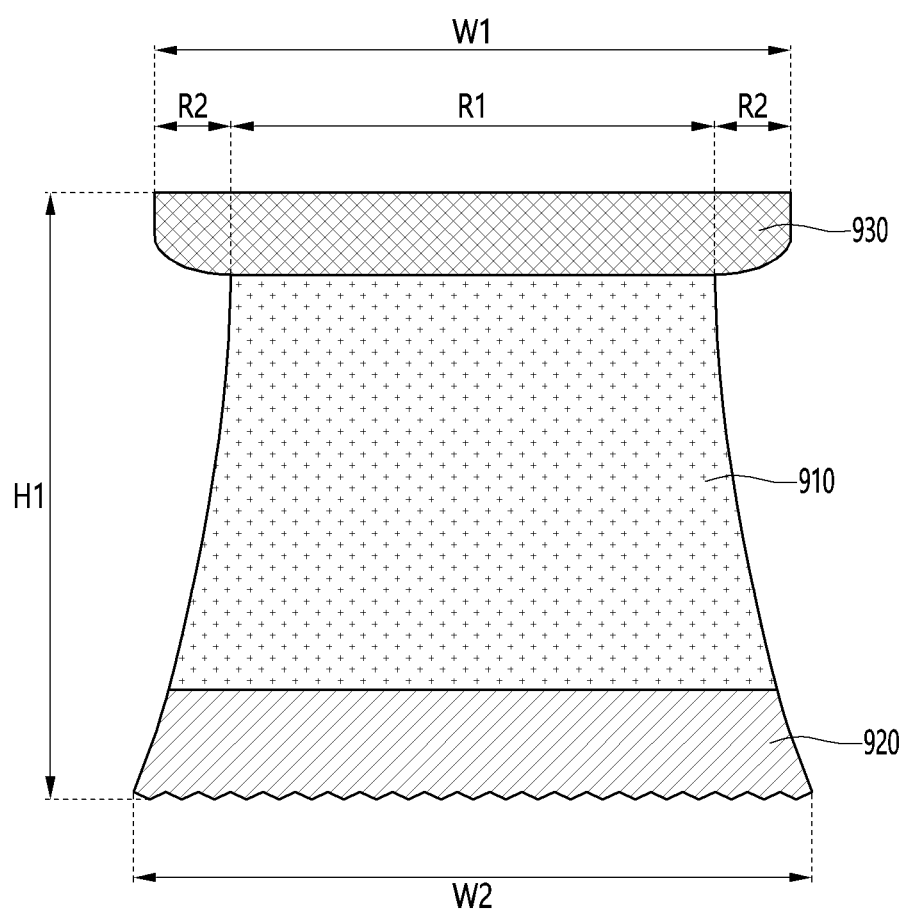
FIG. 8 is a view for describing a layer structure of a metal layer of a pattern part according to a first embodiment.
Figure 9:
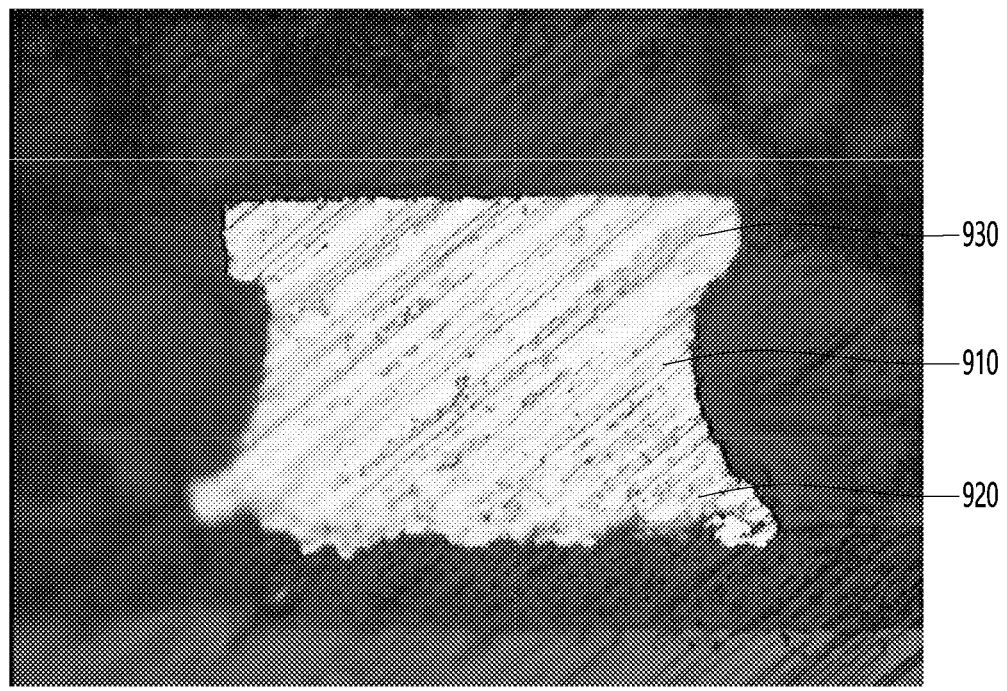
FIG. 9 is a view showing an optical microscope photograph of a vertical cross-section of a pattern part in an actual product according to an embodiment of FIG. 9.

FIG. 8 is a view for describing a layer structure of a metal layer of a pattern part according to a first embodiment, and FIG. 9 is a view showing an optical microscope photograph of a vertical cross-section of a pattern part in an actual product according to an embodiment of FIG. 9.

Referring to FIGS. 8 and 9, the pattern part 720 includes a metal layer and a surface treatment layer. The metal layer may include a third metal layer 920, a first metal layer 910 on the third metal layer 920, and a second metal layer 930 on the first metal layer 910.

In this case, the third metal layer 920 may be omitted. When the third metal layer 920 is omitted, a lower surface of the pattern part 720 may be a lower surface of the first metal layer 910 instead of the third metal layer 920.

The second metal layer 930 may have an etching rate different from those of the first metal layer 910 and the third metal layer 920.

For example, the etching rate of the second metal layer 930 in the embodiment may be slower than the etching rate of the first metal layer 910 and the third metal layer 920. For example, when etching is performed under the same conditions, a degree of etching of the second metal layer 930 may be less than a degree of etching of the first metal layer 910 and the third metal layer 920.

Through this, the pattern part 720 in the embodiment may have a shape different from that of the pattern part in Comparative Example due to the second metal layer 930. For example, the first metal layer 910 and the third metal layer 920 may correspond to shapes of the first metal layer 810 and the third metal layer 820 of Comparative Example.

However, in the embodiment, the overall shape of the pattern part 720 may be different from that of Comparative Example according to etching characteristics of the second metal layer 930.

Specifically, the etching rates of the second metal layer 930 and the first metal layer 910 may be different from each other. That is, the etching rate of the first metal layer 910 may be faster than that of the second metal layer 930. Through this, as the first metal layer 910 is etched more than the second metal layer 930, the second metal layer 930 may have an inwardly concave curved surface or a tapered shape. In addition, the third metal layer 920 may have a similar etching rate to that of the first metal layer 910, and thus the third metal layer 920 may have a shape corresponding to the first metal layer 910. However, since the second metal layer 930 is etched at an etching rate slower than that of the second metal layer 930 and the first metal layer 910, the second metal layer 930 may be close to a quadrangle in the vertical cross section. For example, widths of the upper surface and the lower surface of the second metal layer 930 may be similar to each other. For example, the width of the upper surface of the second metal layer 930 may satisfy a range of 95% to 105% of the width of the lower surface thereof. A boundary portion between the upper surface and a side surface of the second metal layer 930 or a boundary portion between the side surface and the lower surface of the second metal layer 930 may have a curved surface.

In this case, the second metal layer 930 may include a first region R1 that vertically overlaps the upper surface of the first metal layer 910 and a second region R2 that does not vertically overlap the upper surface of the first metal layer 910 and vertically overlaps with a side surface of the first metal layer 910. For example, at least one of a width W1 of the upper surface and a width of the lower surface of the second metal layer 930 may be greater than a width of the upper surface of the first metal layer 910. For example, the second metal layer 930 may have an overhang structure that is spaced apart from the upper surface of the first metal layer 910 and protrudes outward.

Through this, the second metal layer 930 may include the first region R1 that vertically overlaps the upper surface of the first metal layer 910 and the second region R2 that does not vertically overlap the upper surface of the first metal layer 910 and vertically overlaps with the side surface of the first metal layer 910.

In this case, the second region R2 of the second metal layer 930 may vertically overlap a side surface of the first metal layer 910 rather than the upper surface of the first metal layer 910.

In addition, at least a part of the second region R2 of the second metal layer 930 may vertically overlap a side surface of the third metal layer 920. Through this, in the embodiment, the difference between the width of the upper surface of the pattern part 720 and the width of the lower surface of the pattern part 720 may be reduced, thereby increasing the etching factor.

For example, in Comparative Example, the same layer as the second metal layer 930 of the embodiment does not exist, and thus has a low etching factor. In contrast, in the embodiment, the second metal layer 930 is formed on the first metal layer 910, and the second metal layer 930 has an overhang structure. Accordingly, in the embodiment, compared to Comparative Example, the difference between the width of the upper surface and the lower surface of the pattern part 720 may be reduced by a width corresponding to the second region R2, thereby increasing the etching factor.

Specifically, it was confirmed that the etching factor according to the width W1 of the upper surface, the width W2 of the lower surface, and the thickness H1 of the pattern part 720 in the embodiment was 2.5 or more.

For example, it was confirmed that the width W1 of the upper surface of the pattern part 720 was 54.30 µm, the width W2 of the lower surface was 67.24 µm, and the thickness H1 was about 40.58. Through this, it was confirmed that the etching factor of the pattern part 720 of the embodiment was about 2.641.

In addition, in the embodiment, it was confirmed that the specific resistance value in a unit area of the pattern part 720 was lowered by forming the second metal layer 930 on the first metal layer 910.

Specifically, as the pattern part 720 in the embodiment has a structure in which the second metal layer 930 having high electrical conductivity is disposed on the first metal layer 910, it was confirmed that the specific resistance value in a unit area (3 cm*3 cm) had a level of 7.14 µΩ*cm, which is 41% of Comparative Example. Through this, in the embodiment, it is possible to have a high allowable current and a high transmission speed that can be applied to the high-resolution image sensor of the pattern part 720.

More specifically, it was confirmed that as the thickness of the second metal layer 930 in the pattern part 720 increased, the specific resistance value in the unit area (3 cm*3 cm) also decreased.

For example, when the thickness of the second metal layer 930 is 4 μm, it was confirmed that the specific resistance value in the unit area (3 cm*3 cm) was 7.14 μΩ*cm level, and when the thickness of the second metal layer is 8 μm, it was confirmed that the specific resistance value was further lowered to 5.49 μΩ*cm.

However, when the thickness of the second metal layer 930 is 15 μm, it was confirmed that the specific resistance value in the unit area (3 cm*3 cm) was 2.8 μΩ*cm. However, when the thickness of the second metal layer 930 exceeds 15 μm, it was confirmed that the specific resistance value in the unit area (3 cm*3 cm) was similar to the 2.8 μΩ*cm level, and rather it was confirmed that the etching factor was lowered.

Figure 10:
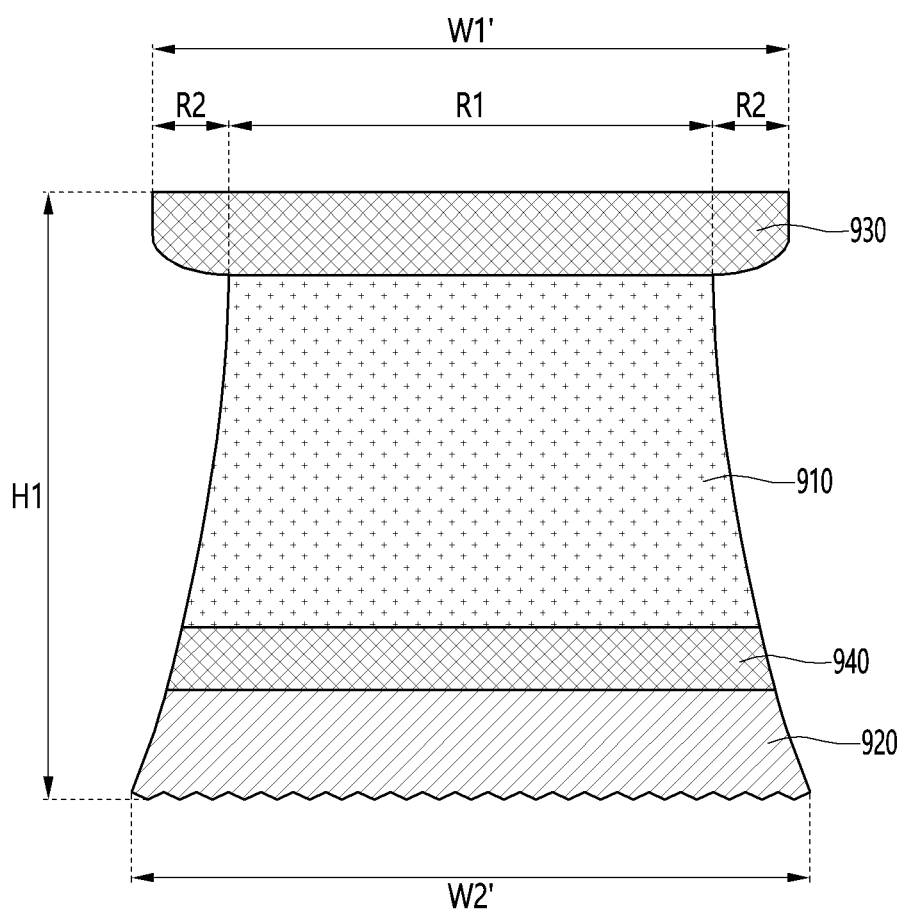
FIG. 10 is a view for describing a layer structure of a metal layer of a pattern part according to a second embodiment.
Figure 11:
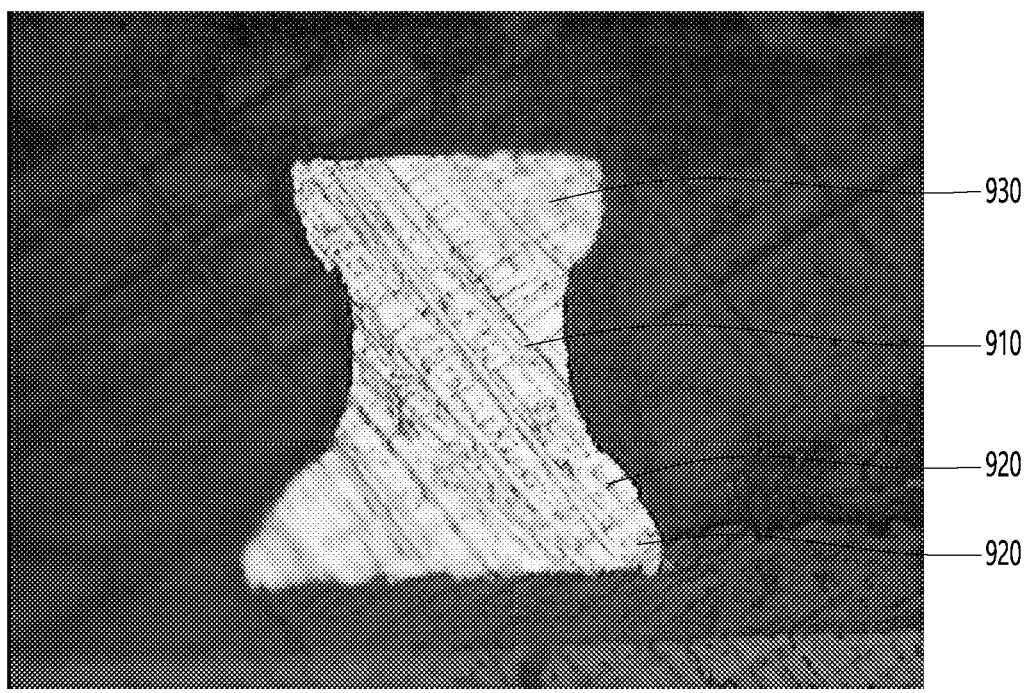
FIG. 11 is a view showing an optical microscope photograph of a vertical cross-section of a pattern part in an actual product according to FIG. 10.

FIG. 10 is a view for describing a layer structure of a metal layer of a pattern part according to a second embodiment, and FIG. 11 is a view showing an optical microscope photograph of a vertical cross-section of a pattern part in an actual product according to FIG. 10.

Referring to FIG. 10, a pattern part 720 according to the second embodiment is similar to the layer structure of the pattern part 720 of FIG. 8. However, a second metal layer in FIG. 10 may be disposed on a lower surface as well as an upper surface of a first metal layer.

That is, the pattern part 720 according to the second embodiment may include a first metal layer 910. In addition, the pattern part 720 of the second embodiment may include the second metal layer. For example, the second metal layer may include a 2-1 metal layer 930 disposed on the upper surface of the first metal layer 910. The 2-1 metal layer 930 may correspond to the second metal layer 930 described in the first embodiment. Accordingly, a description thereof will be omitted.

Meanwhile, the pattern part 720 of the second embodiment may further include a 2-2 metal layer 940 disposed on the lower surface of the first metal layer 910. In this case, when the pattern part includes the third metal layer 920, the 2-2 metal layer 940 may be disposed between the first metal layer 910 and the third metal layer 920. The 2-2 metal layer 940 may have a thickness in a range of 1 μm to 15 in a range of 2 μm to 13 μm, or in a range of 3 μm to 12 μm.

Meanwhile, the 2-2 metal layer 940 is a metal layer having the same characteristics as the 2-1 metal layer 930, but the 2-2 metal layer 940 may have an etching rate different from that of the 2-1 metal layer 930.

That is, the 2-2 metal layer 940 may be etched in a state disposed between the first metal layer 910 and the third metal layer 920. Accordingly, the 2-2 metal layer 940 may follow etching characteristics of the first metal layer 910 and the third metal layer 920. Therefore, a side surface of the 2-2 metal layer 940 may have a curved surface or a tapered shape corresponding to a side surface of the first metal layer 910 and a side surface of the third metal layer 920.

In this case, when the 2-2 metal layer 940 is disposed between the first metal layer 910 and the third metal layer 920, the specific resistance in a unit area may be further reduced.

That is, when the overall thickness of the metal layer is 8 μm the specific resistance value was confirmed when the 2-1 metal layer 930 is formed to be 8 μm in a state in which only the 2-1 metal layer 930 is present and when each of the 2-1 metal layer 930 and the 2-2 metal layer 940 is formed to be 4 μm. And as a result, it was confirmed that the specific resistance value when including both the 2-1 metal layer 930 and the 2-2 metal layer 940 was 5.10 μΩ*cm. This is a lower value than the case in which only the second metal layer 930 is formed in a thickness of 8 μm. However, when a thickness of the 2-2 metal layer 940 increases, it was confirmed that the specific resistance value is decreased, but the etching factor of the pattern part 720 is also decreased. Accordingly, in the embodiment, the 2-2 metal layer 940 is formed within a range of maintaining the etching factor at a certain level, so that the specific resistance value may be lowered without affecting the etching factor.

For example, when the thickness of the 2-2 metal layer 940 is smaller than or equal to the thickness of the 2-1 metal layer 930, it can be confirmed that the etching factor of the pattern part 720 is lowered. Accordingly, in the embodiment, the thickness of the 2-1 metal layer 930 may be greater than that of the 2-2 metal layer 940 so as to increase the etching factor while lowering the overall specific resistance value of the pattern part 720.

Meanwhile, as shown in FIG. 10, a second region R2 of the 2-1 metal layer 930 may include a region that vertically overlaps each of the side surface of the first metal layer 910, the side surface of the 2-2 metal layer 940, and the side surface of the third metal layer 920.

Figure 12:
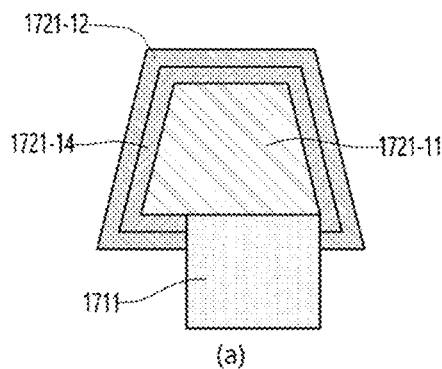
FIG. 12 is a view for describing a layer structure of a metal layer of a pattern part according to a third embodiment.
Figure 12:
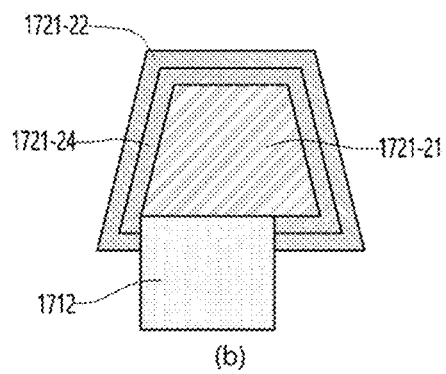
Figure 12:
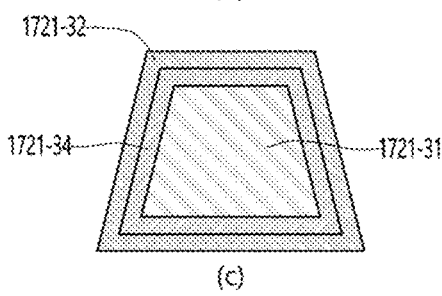

FIG. 12 is a view for describing a layer structure of a metal layer of a pattern part according to a third embodiment.

In the third embodiment, a layer structure of the second metal layer may be different from those of the first and second embodiments. That is, the second metal layer of the first embodiment was disposed only on the upper surface of the first metal layer. Alternatively, the second metal layer of the second embodiment was disposed on the upper surface and the lower surface of the first metal layer. Alternatively, the second metal layer according to the third embodiment may be disposed to entirely cover the upper surface, the lower surface, and the side surface of the first metal layer. In addition, the metal layer of the pattern part according to the third embodiment may have a structure in which the third metal layer is omitted. However, in the first and second embodiments, the second metal layer may be formed on the first metal layer before the etching process for forming the pattern part is performed. Alternatively, the second metal layer in the third embodiment may be formed on the first metal layer after an etching process for forming the pad part is performed.

That is, FIG. 12A may be a view showing a first terminal portion 721-1. At least a part of a lower surface of a first metal layer 1721-11 of the first terminal portion 721-1 may be in contact with a first insulating region 1711. Therefore, the second metal layer 1721-14 of the first terminal portion 721-1 may be partially disposed on the lower surface of the first metal layer 1721-11 and may be entirely disposed on a side surface and an upper surface of the first metal layer 1721-11. In addition, a surface treatment layer 1721-12 of the first terminal portion 721-1 may be disposed to surround the second metal layer 1721-14.

That is, FIG. 12B may be a view showing a second terminal portion 721-2. At least a part of a lower surface of a first metal layer 1721-21 of the second terminal portion 721-2 be in contact with a second insulating region 1712. Therefore, the second metal layer 1721-24 of the second terminal portion 721-2 may be partially disposed on the lower surface of the first metal layer 1721-21 and may be entirely disposed on a side surface and an upper surface of the first metal layer 1721-21. In addition, a surface treatment layer 1721-22 of the second terminal portion 721-2 may be disposed to surround the second metal layer 1721-24.

That is, FIG. 12C may be a view showing a connecting portion 721-3. The connecting portion 721-3 may not be in contact with an insulating part. Therefore, a second metal layer 1721-34 of the connecting portion 721-3 may be disposed to entirely surround the upper surface, the lower surface, and the side surface of the first metal layer 1721-31. In addition, a surface treatment layer 1721-32 of the connecting portion 721-3 may be disposed to surround the second metal layer 1721-34.

Figure 13:
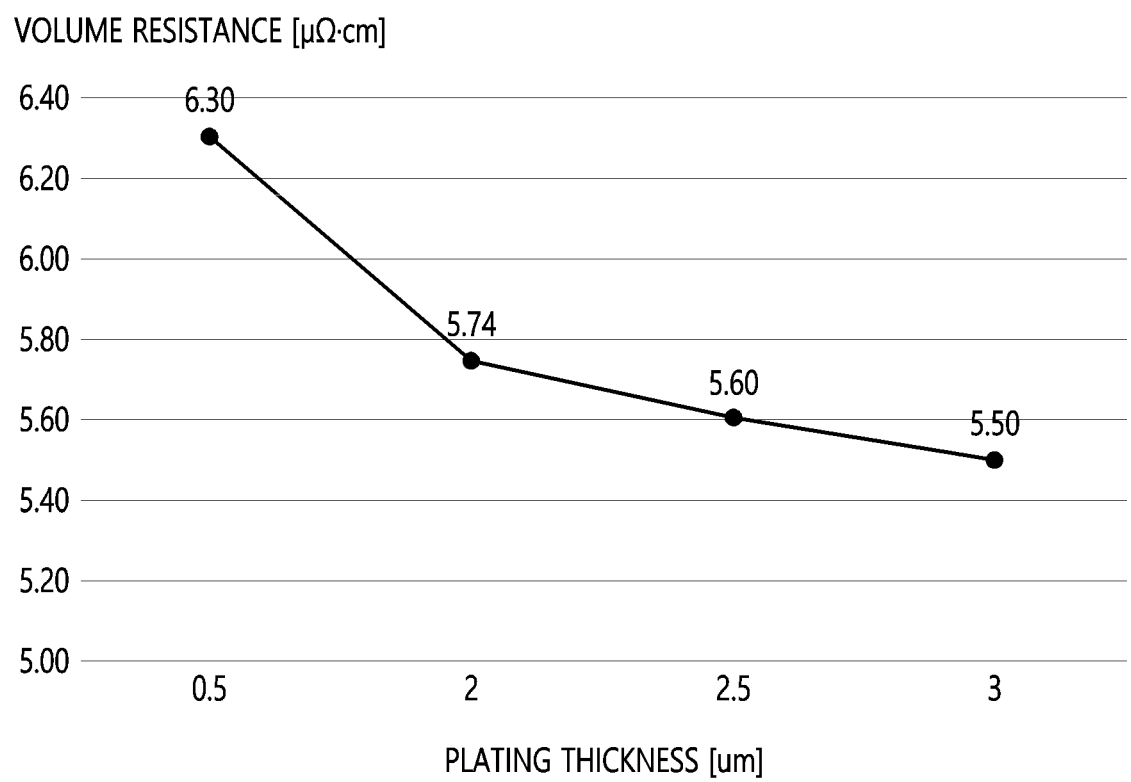
FIG. 13 is a graph showing a specific resistance value of a pattern part according to a thickness of a second metal layer according to the third embodiment.

FIG. 13 is a graph showing a specific resistance value of a pattern part according to a thickness of a second metal layer according to the third embodiment.

Referring to FIG. 13, in the embodiment, it was confirmed that as the thickness of the second metal layers 1721-14, 1721-24, and 1721-34 increased, the specific resistance value of the pattern part decreased in inverse proportion. Therefore, in the third embodiment, the second metal layer is disposed not only on the upper and lower surfaces of the first metal layer but also on the side surfaces thereof. Through this, it is possible to further lower the specific resistance value of the pattern part using the second metal layer having a relatively small thickness.

Referring to FIG. 13, the specific resistance value was a level of 17.29 $\mu\Omega$*cm before the second metal layers 1721-14, 1721-24, and 1721-34 are formed.

In addition, when the thickness of the second metal layers 1721-14, 1721-24, and 1721-34 was 0.5 µm, it was confirmed that the specific resistance value of the pattern part decreased to a level of 6.30 $\mu\Omega$*cm.

In addition, when the thickness of the second metal layers 1721-14, 1721-24, and 1721-34 was 2.0 µm, it was confirmed that the specific resistance value of the pattern part decreased to a level of 5.74$\mu\Omega$*cm.

In addition, when the thickness of the second metal layers 1721-14, 1721-24, and 1721-34 was 2.5 µm, it was confirmed that the specific resistance value of the pattern part decreased to a level of 5.60 $\mu\Omega$*cm.

In addition, when the thickness of the second metal layers 1721-14, 1721-24, and 1721-34 was 3.0 µm, it was confirmed that the specific resistance value of the pattern part decreased to a level of 5.50 $\mu\Omega$*cm.

Further, when the thickness of the second metal layers 1721-14, 1721-24, and 1721-34 exceeds 4.0 µm, a degree of decrease in the specific resistance value is insignificant. Furthermore, when the thickness of the second metal layers 1721-14, 1721-24, and 1721-34 is less than 0.5 µm, the specific resistance value of the pattern part has a level similar to a specific resistance value of the first metal layer.

Accordingly, the second metal layers 1721-14, 1721-24, and 1721-34 according to the third embodiment may have a thickness in a range of 0.5 µm to 4.0 µm. For example, the thickness of the second metal layers 1721-14, 1721-24, and 1721-34 in the third embodiment may be a thickness in a range of 1.0 µm to 3.5 µm. For example, the thickness of the second metal layers 1721-14, 1721-24, and 1721-34 in the third embodiment may be a thickness in a range of 1.5 µm to 3.0 µm.

When the thickness of the second metal layers 1721-14, 1721-24, and 1721-34 is less than 0.5 µm, the degree of reduction in the specific resistance value is insignificant, and thus electrical characteristics may be deteriorated. In addition, when the thickness of the second metal layers 1721-14, 1721-24, and 1721-34 exceeds 4 µm, a weight of the pattern part of the connecting portion in the open region increases, and accordingly, a reliability problem may occur that the connecting portion sags downward. In addition, when the thickness of the second metal layers 1721-14, 1721-24, and 1721-34 exceeds 4 µm, a spacing between the pattern parts should be determined in consideration of this, and accordingly, a degree of integration of the circuit pattern may decrease.

Figure 14:
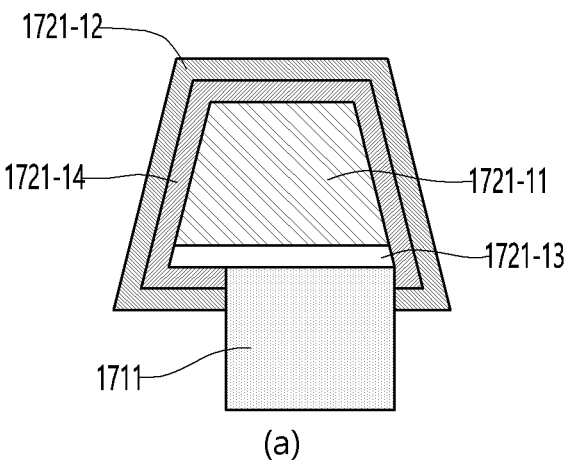
FIG. 14 is a view for describing a layer structure of a metal layer of a pattern part according to a fourth embodiment.
Figure 14:
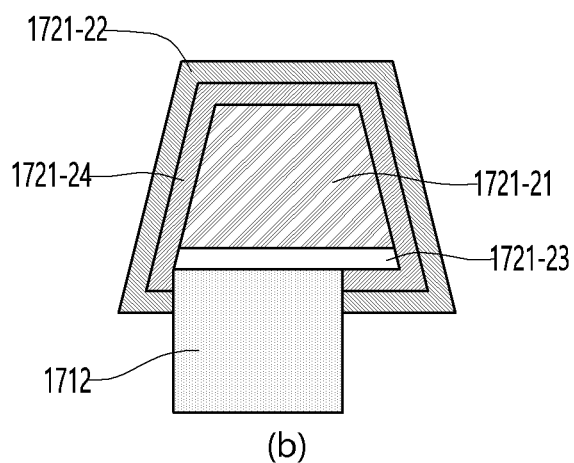
Figure 14:
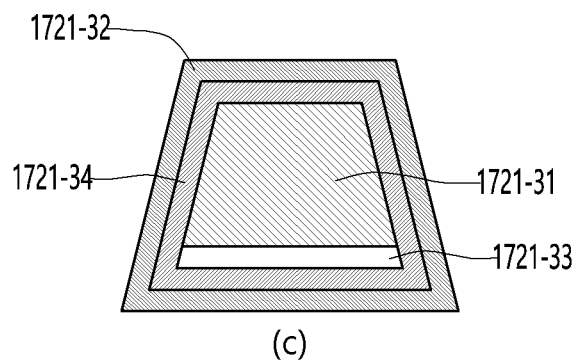

FIG. 14 is a view for describing a layer structure of a metal layer of a pattern part according to a fourth embodiment.

Referring to FIG. 14, the metal layer of the pattern part of the embodiment may have a structure in which third metal layers 1721-13, 1721-23, and 1721-33 are additionally disposed on the lower surface of the first metal layers 1721-11, 1721-21, and 1721-31 in the metal layer of the pattern part of the third embodiment.

That is, referring to FIG. 14A, a third metal layer 1721-13 may be disposed on the lower surface of the first metal layer 1721-11 of the first terminal portion 721-1. Therefore, the second metal layer 1721-14 may be disposed to cover the upper surface and the side surface of the first metal layer 1721-11 and a side surface and a lower surface of the third metal layer 1721-13.

That is, referring to FIG. 14B, a third metal layer 1721-23 may be disposed on the lower surface of the first metal layer 1721-21 of the second terminal portion 721-2. Therefore, the second metal layer 1721-24 of the second terminal portion 721-2 may be disposed to cover the upper surface and the side surface of the first metal layer 1721-21 and a side surface and a lower surface of the third metal layer 1721-23.

That is, referring to FIG. 14C, a third metal layer 1721-33 may be disposed on the lower surface of the first metal layer 1721-31 of the connecting portion 721-3. Therefore, the second metal layer 1721-34 may be disposed to cover the upper surface and the side surface of the first metal layer 1721-31 and a side surface and a lower surface of the third metal layer 1721-33.

A lens driving device according to an embodiment includes a circuit board for moving an image sensor connected to a sensor part. The circuit board includes an insulating part and a pattern part. In addition, the pattern part includes a metal layer and a surface treatment layer formed on the metal layer. In this case, the metal layer may include a first metal layer and a second metal layer. The second metal layer may be provided to solve low electrical conductivity and high resistivity of the first layer.

For example, the second metal layer is formed of a metal material having high electrical conductivity. Through this, in the embodiment, it is possible to lower the specific resistance value while lowering the overall electrical conductivity of the pattern part. Accordingly, in the embodiment, an allowable current or a communication speed of the pattern part may be improved. Through this, in the embodiment, it is possible to provide a circuit board for moving an image sensor applicable to an image sensor having a high resolution.

In addition, in the embodiment, when the pattern part is formed through an etching process, the second metal layer is etched with the lowest etching rate. Accordingly, the second metal layer includes a first region that vertically overlaps an upper surface of the first metal layer and a second region that does not vertically overlap the upper surface of the first metal layer. In addition, the second region may vertically overlap a side surface of the first metal layer and at least a part of the side surface of the first metal layer. Through this, in the embodiment, by making a width of the second metal layer larger than that of the upper surface of the first metal layer, a width of an upper surface and a width of a lower surface of the pattern part may be reduced, and further, an etching factor of the pattern part may be increased. Through this, in the embodiment, the signal transmission loss may be reduced by reducing a difference between an upper width and a lower width of the pattern part, and further, communication performance may be improved.

In addition, in an embodiment, the second metal layer may be disposed only on the upper surface of the first metal layer. In addition, in another embodiment, the second metal layer may be disposed on the upper surface and the lower surface of the first metal layer, respectively. Accordingly, in the embodiment, it is possible to increase the electrical conductivity while further lowering a specific resistance value of the pattern part. Through this, in the embodiment, it is possible to further increase the allowable current of the pattern part and improve the communication speed of the pattern part.

In addition, in the embodiment, a thickness of a 2-1 metal layer disposed on the first metal layer among the second metal layers is greater than the thickness of a 2-2 metal layer disposed under the first metal layer. Through this, it is possible to increase the etching factor while lowering the specific resistance value of the pattern part.

Meanwhile, in another embodiment, the second metal layer may be provided to entirely cover an outer surface of the first metal layer, that is, the second metal layer is formed on the first metal layer after the first metal layer is etched. Accordingly, the second metal layer may be disposed on the first metal layer while maintaining a shape of the etched first metal layer. Through this, in the embodiment, it is easy to control a shape of the pattern part, thereby improving the uniformity of the shape of the pattern part. In addition, in the embodiment, as the second metal layer is formed after the first metal layer is etched, the second metal layer is disposed not only on the upper surface of the first metal layer but also on a part of the side surface and the lower surface. Accordingly, in an embodiment, a thickness of the second metal layer required to reduce the specific resistance value of the pattern part to a certain level or less may be reduced. Accordingly, in the embodiment, as the thickness of the second metal layer increases, the specific resistance value may be further lowered, and the thickness of the second metal layer required for a target specific resistance value may be reduced. Through this, in the embodiment, product reliability may be further improved and product unit price may be reduced.

In addition, in the embodiment, in forming the surface treatment layer, the surface treatment layer is in contact with the second metal layer. For example, the first metal layer is covered by the second metal layer, whereby the surface treatment layer is not in contact with the first metal layer. Accordingly, in the embodiment, the stability of chemical reaction may be secured, thereby improving the uniformity of a structure of the surface treatment layer.

In addition, the surface treatment layer in the embodiment may be a thin film formed by coating an organic material. In this case, a relative permittivity $\varepsilon_r$ of an organic material is 3.24. This is a value significantly smaller than a relative permittivity $\varepsilon_r$ of nickel or gold (Au) constituting a conventional surface treatment layer. For example, the relative permittivity $\varepsilon_r$ of the nickel or gold (Au) is 4 or more. Accordingly, in the embodiment, by forming the surface treatment layer through organic material coating, it is possible to improve a signal transmission speed of a wiring inversely proportional to the relative permittivity. Accordingly, in the embodiment, product reliability of the circuit board may be improved.

In addition, thermal conductivity of the organic material constituting the surface treatment layer of the embodiment is greater than that of a conventional nickel or metal layer. Accordingly, in the embodiment, it is possible to increase thermal conductivity of the pattern part including the surface treatment layer. Here, recently, in a product such as a camera module, heat dissipation characteristics have emerged as a major problem. That is, various components included in the camera module have a problem of being vulnerable to heat dissipation, and accordingly, efforts are being made to improve heat dissipation characteristics. In this case, in the embodiment, in the surface treatment of the pattern part as described above, the thermal conductivity of the pattern part may be increased by applying the surface treatment layer through the organic coating, and thus, it is possible to improve heat dissipation characteristics of the circuit board, and further, heat dissipation characteristics of the camera module to which the circuit board is applied.

In addition, in the embodiment, the pattern part included in the circuit board is one of components of the first moving part. That is, the connecting portion constituting the pattern part may move in a plurality of directions during operation of the camera module. For example, the connecting portion is shifted or tilted in at least one direction of an X-axis, a Y-axis, and a Z-axis together with an image sensor in order to auto-focus the camera module or inhibit hand shake. In this case, the pattern part included in the circuit board may be in contact with other components during the moving operation as described above. In addition, when the pattern part is in contact with other components, a problem may occur in electrical reliability of the pattern part. In this case, in the embodiment, by forming the surface treatment layer through the organic coating of the pattern part as described above, it is possible to improve the electrical reliability. For example, in the embodiment, the surface treatment layer has electrical conductivity lower than that of the conventional nickel or gold (Au). Accordingly, in the embodiment, when the pattern part is in contact with other components, the surface treatment layer may perform an insulating function, thereby improving the electrical reliability of the circuit board. In addition, in the embodiment, as the surface treatment layer of the pattern part is formed through the organic coating, the plating process may be simplified compared to the conventional surface treatment layer, and further, costs of the plating process may be reduced.

A lens driving device according to an embodiment includes a sensor part and a circuit board for moving an image sensor connected to the sensor part. The circuit board may be an interposer. The sensor part includes a sensor board connected to the circuit board and an image sensor mounted on the sensor board. In this case, the sensor board includes an electrical pad electrically connected to the circuit board and a fixing pad other than the electrical pad. In this case, the circuit board may include an open portion into which the fixing pad of the sensor board is inserted. Accordingly, in the embodiment, during a soldering process of the circuit board and the sensor board, it is possible to facilitate alignment between the circuit board and the sensor board by inserting the fixing pad into the open portion of the circuit board. Further, in an embodiment, in a state in which positions of the circuit board and the sensor board are aligned, the movement of the sensor board may be restricted, and accordingly, in the soldering process, a position shift problem between the circuit board and the sensor board may be solved, thereby improving workability. In addition, in the embodiment, it is possible to improve the positional alignment between the sensor board and the circuit board, thereby improving the electrical connectivity between the sensor board and the circuit board, and further, it is possible to improve product reliability.

In addition, in the embodiment, the circuit board includes an insulating part and a pattern part. The insulating part includes a first insulating region, a second insulating region, and an open region therebetween. In addition, the pattern part includes a first terminal portion disposed in the first insulating region and connected to the sensor board, a second terminal portion disposed in the second insulating region and connected to a main substrate, and a connecting portion disposed in the open region and connecting the first terminal portion and the second terminal portion. In this case, the connecting portion includes a bent portion disposed at each corner portion of the open region. In this case, each bent portion of the connecting portion is bent in the same direction as each other as a rotational direction at the corner portion. Accordingly, in the embodiment, the mobility of the sensor part by the circuit board may be improved by a structure of the connecting portion as described above, but furthermore, the accuracy of a movement position of the sensor part may be improved.

In addition, in the embodiment, the bent portion of the connecting portion includes a first open region that opens a partial region at each corner portion of the open region. In this case, the first open region may be formed at a position overlapping a protrusion of a second frame constituting the first moving part 200 in the optical axis direction. In addition, the connecting portion includes an inner connecting portion disposed inside the first open region and an outer connecting portion disposed outside the first open region while avoiding the first open region. In this case, the number of the inner connecting portions may be smaller than that of the outer connecting portions. Accordingly, in the embodiment, in the connecting portion as described above, the mobility of the first moving part may be increased by making the number of the outer connecting portions disposed outside the first open region greater than the number of the inner connecting portions disposed inside the first open region. For example, when the number of the outer connecting portions is greater than the number of the inner connecting portions, it may be easier to control an amount of movement of the first moving part than when the number of the outer connecting portions is smaller than the number of the inner connecting portions. For example, as the outer connecting portion is disposed outside the first open region OR, a length of the outer connecting portion may be greater than that of the inner connecting portion. In addition, since the length of the outer connecting portion is greater than that of the inner connecting portion, the intensity of a driving force required to move the first moving part may be reduced compared to the inner connecting portion. Accordingly, in the embodiment, the mobility of the first moving part may be improved, and further, the amount of movement of the first moving part may be finely adjusted by making the number of the outer connecting portions greater than the number of the inner connecting portions.

In addition, in the embodiment, each of the outer connecting portion and the inner connecting portion includes a plurality of bending points. In this case, the number of bending points of the outer connecting portion may be the same as the number of bending points of the inner connecting portion. Accordingly, in the embodiment, the mobility of the first moving part may be increased by making the number of bending points of the outer connecting portion equal to the number of bending points of the inner connecting portion. For example, when the number of bending points of the outer connecting portion is different from the number of bending points of the inner connecting portion, force may be concentrated on a connecting portion having more bending points, and accordingly, a problem that the connecting portion on which the force is concentrated is broken earlier than another connecting portion may occur, and further, a problem may occur in movement accuracy of the first moving part. Alternatively, in the embodiment, the number of bending points of the outer connecting portion and the number of bending points of the inner connecting portion are made equal to each other, and accordingly, when the first moving part moves, the force applied to the inner connecting portion and the outer connecting portion may be uniformly distributed. Accordingly, in the embodiment, as the force is uniformly distributed to the inner connecting portion and the outer connecting portion, a problem that a specific connecting portion is broken first may be solved, and further, even when the connecting portion is broken, it is possible to make the internal connecting portion and the outer connecting portion break at the same time.

Figure 15:
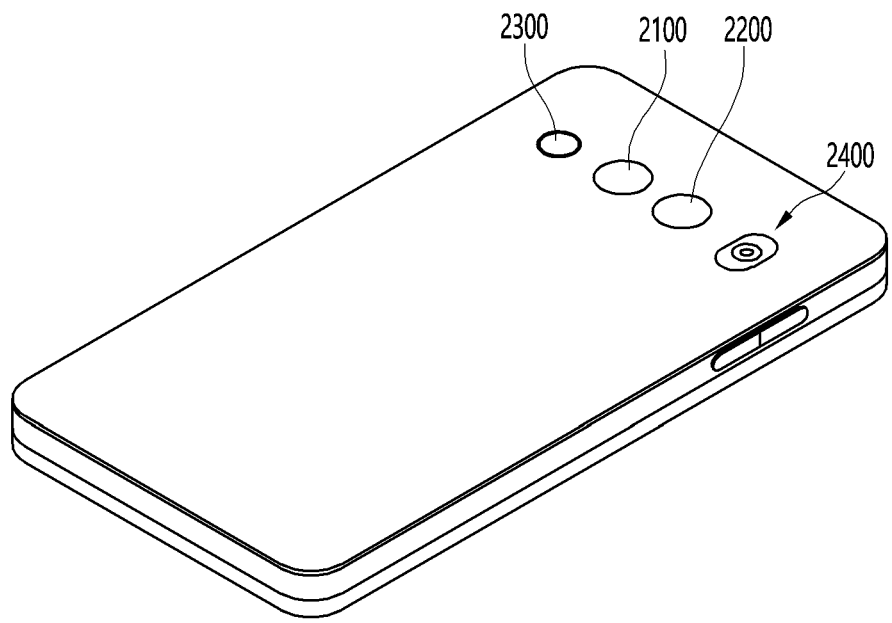
FIG. 15 is a view showing a mobile terminal to which a camera module according to an embodiment is applied.

FIG. 15 is a view showing a mobile terminal 2000 to which a camera module according to an embodiment is applied.

As shown in FIG. 15, the mobile terminal 2000 according to the embodiment may include a camera module 2100, a flash module 2400, and an autofocus device 2300 provided on a back surface. The mobile terminal 2000 of the embodiment may further include a second camera module 2200.

The camera module 2100 may include an image capturing function and an autofocus function. For example, the camera module 2100 may include an autofocus function using an image.

The camera module 2100 processes a still image or a moving image frame obtained by an image sensor in a photographing mode or a video call mode. The processed image frame may be displayed on a predetermined display unit and may be stored in a memory. A camera (not shown) may be disposed on a front surface of the body of the mobile terminal.

For example, the camera module 2100 may include a first camera module and a second camera module, and OIS may be implemented together with an AF or zoom function by the first camera module.

The flash module 2400 may include a light-emitting device that emits light therein. The flash module 2400 may be operated by a camera operation of the mobile terminal or control of a user.

The autofocus device 2300 may include one of packages of a surface light emitting laser element as a light-emitting unit.

The autofocus device 2300 may include an autofocus function using a laser. The autofocus device 2300 may be mainly used in a condition in which the autofocus function using the image of the camera module 2100 is deteriorated, for example, in a close environment of 10 m or less or a dark environment. The autofocus device 2300 may include a light-emitting unit including a vertical cavity surface emitting laser (VCSEL) semiconductor device and a light receiving unit that converts light energy into electric energy such as a photodiode.

Figure 16:
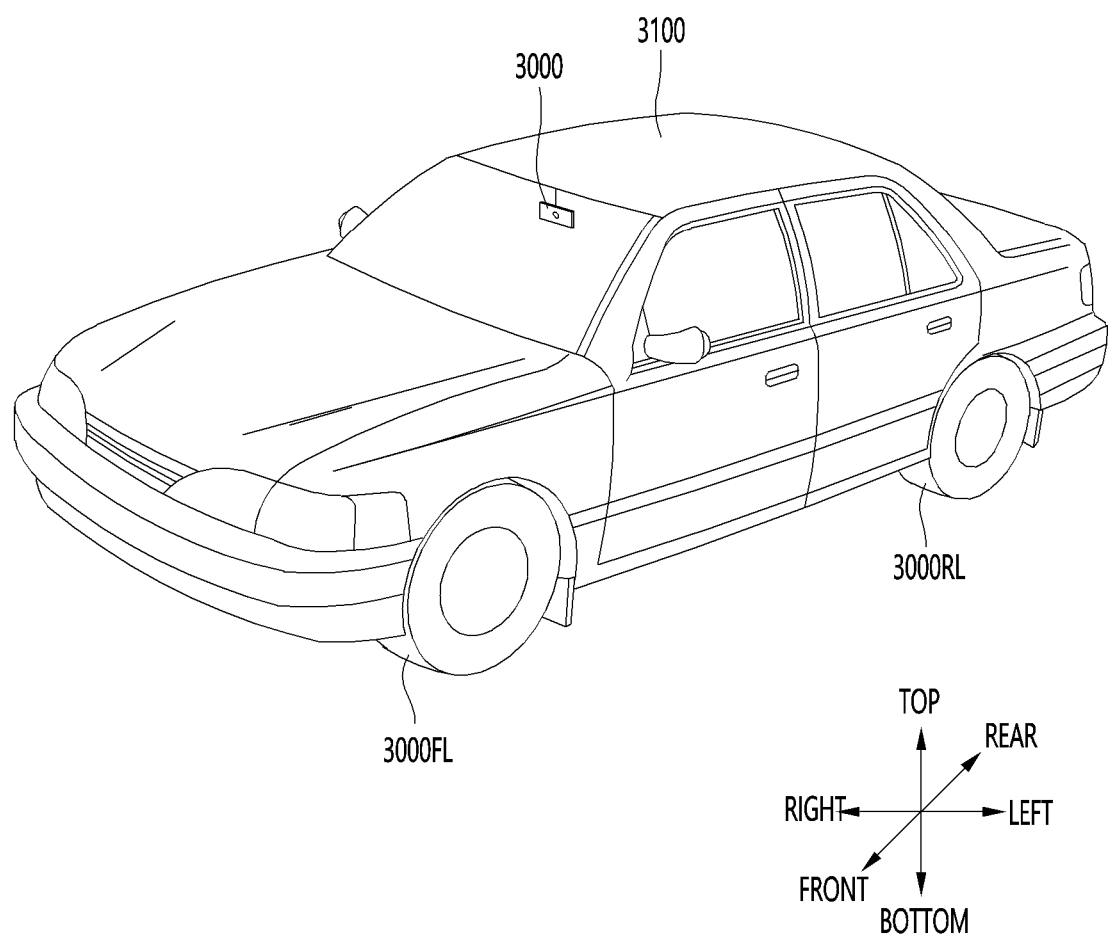
FIG. 16 is an appearance view of a vehicle including a vehicle driving assistance device to which the camera module according to the embodiment is applied.

FIG. 16 is an appearance view of a vehicle including a vehicle driving assistance device to which the camera module according to the embodiment is applied.

Referring to FIG. 16, a vehicle 3100 according to the embodiment may include wheels 3000FL and 3000FR that rotate by a power source and a predetermined sensor. The sensor may be a camera sensor 3000, but the embodiment is not limited thereto.

The camera sensor 3000 may be a camera sensor to which the camera module 2100 according to the embodiment is applied.

The vehicle 3100 according to the embodiment may acquire image information through the camera sensor 3000 that photographs a front image or a surrounding image, and may determine an unidentified situation of a lane using the image information and may generate a virtual lane at the time of unidentification.

For example, the camera sensor 3000 may acquire the front image by photographing a front of the vehicle 3100, and a processor (not shown) may acquire the image information by analyzing an object included in the front image.

For example, when objects such as a lane, a neighboring vehicle, a traveling obstacle, and a median strip, a curb, and a street tree corresponding to an indirect road marking are photographed in an image photographed by the camera sensor 3000, the processor detects the object to be included in the image information.

In this case, the processor may acquire distance information with the object detected through the camera sensor 3000 to further complement the image information. The image information may be information about an object photographed in the image.

The camera sensor 3000 may include an image sensor and an image processing module. The camera sensor 3100 may process a still image or a moving image acquired by the image sensor (e.g., CMOS or CCD). The image processing module may process the still image or the moving image acquired through the image sensor to extract necessary information and may transmit the extracted information to the processor.

The characteristics, structures and effects described in the embodiments above are included in at least one embodiment but are not limited to one embodiment. Furthermore, the characteristics, structures, and effects and the like illustrated in each of the embodiments may be combined or modified even with respect to other embodiments by those of ordinary skill in the art to which the embodiments pertain. Thus, it should be construed that contents related to such a combination and such a modification are included in the scope of the embodiment.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the embodiment defined in the appended claims.

What is claimed is:

1. A circuit board comprising:
   an insulating part; and a pattern part disposed on the insulating part,
   wherein the insulating part includes first and second insulating regions spaced apart from each other with an open region interposed therebetween,
   the pattern part includes: a first terminal portion disposed in a plurality of first side regions of the first insulating region adjacent to the open region; a second terminal portion disposed on a plurality of second side regions of the second insulating region facing the plurality of first side regions with the open region interposed therebetween; and a connecting portion disposed in the open region and connecting between the first and second terminal portions,
   wherein the connecting portion includes a plurality of bent portions connecting between the first terminal portion and the second terminal portion disposed in the first side region and the second side region which do not face each other and formed at a plurality of corners of the open region,
   the plurality of bent portions are bent to rotate in the same direction as each other,
   each of the first terminal portion, the second terminal portion, and the connecting portion includes
   a metal layer and a surface treatment layer disposed on the metal layer, and
   the metal layer includes a first metal layer and a second metal layer disposed on the first metal layer and having an electrical conductivity different from that of the first metal layer.

2. The circuit board of claim 1, comprising a third metal layer disposed between the insulating part and the first metal layer.

3. The circuit board of claim 1, wherein an electrical conductivity of the second metal layer is greater than that of the first metal layer.

4. The circuit board of claim 2, wherein a surface roughness of an upper surface of the second metal layer is lower than that of a lower surface of the third metal layer.

5. The circuit board of claim 1, wherein the second metal layer includes
   a first region that vertically overlaps an upper surface of the first metal layer and
   a second region that does not vertically overlap the upper surface of the first metal layer and vertically overlaps a side surface of the first metal layer.

6. The circuit board of claim 5, wherein a vertical cross-sectional shape of the first metal layer is different from that of the second metal layer.

7. The circuit board of claim 5, wherein the second metal layer is disposed on the upper surface of the first metal layer,
   a lower surface of the first metal layer is not in contact with the second metal layer, and
   the surface treatment layer includes a portion in contact with the first metal layer and a portion in contact with the second metal layer.

8. The circuit board of claim 5, wherein the second metal layer includes
   a 2-1 metal layer disposed on the upper surface of the first metal layer and
   a 2-2 metal layer disposed on the lower surface of the first metal layer, and
   the surface treatment layer includes the portion in contact with the first metal layer, a portion in contact with the 2-1 metal layer, and a portion in contact with the 2-2 metal layer.

9. The circuit board of claim 8, wherein a vertical cross-sectional shape of the 2-1 metal layer is different from that of the 2-2 metal layer.

10. The circuit board of claim 5, wherein the second metal layer has a thickness in a range of 1 μm to 15 μm.

11. The circuit board of claim 8, wherein a thickness of the 2-2 metal layer is smaller than that of the 2-1 metal layer.

12. The circuit board of claim 11, wherein at least a part of the 2-1 metal layer vertically overlaps a side surface of the 2-2 metal layer.

13. The circuit board of claim 1, wherein the second metal layer is respectively disposed on the upper surface, the lower surface, and the side surface of the first metal layer.

14. The circuit board of claim 13, wherein the surface treatment layer is disposed to surround the second metal layer and is not in contact with the first metal layer.

15. The circuit board of claim 13, wherein a thickness of the second metal layer satisfies a range of 0.5 µm to 4.0 µm.

16. The circuit board of claim 13, wherein the first metal layer has a slope in which a width increases from the upper surface toward the lower surface thereof, and
the second metal layer has a slope corresponding to the slope of the first metal layer and is disposed on the side surface of the first metal layer.

17. The circuit board of claim 1, wherein the surface treatment layer includes at least one of an organic material, an inorganic material, and an organic-inorganic composite.

18. A lens driving device comprising:
a fixed part;
a first moving part disposed to be movable relative to the fixed part; and
the circuit board including a region connected to the fixed part and a region connected to the first moving part and included in claim 1.

19. A camera module comprising:
the lens driving device included in claim 18,
wherein the lens driving device includes a second moving part that is disposed inside the first moving part and is relatively movable in an optical axis direction with respect to the fixed part and the first moving part.

* * * * *